United States Patent
Sun et al.

(10) Patent No.: US 9,564,213 B2
(45) Date of Patent: Feb. 7, 2017

(54) PROGRAM VERIFY FOR NON-VOLATILE STORAGE

(71) Applicant: SANDISK TECHNOLOGIES INC., Plano, TX (US)

(72) Inventors: Yongke Sun, Pleasanton, CA (US); Jiahui Yuan, Fremont, CA (US); Yingda Dong, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 23 days.

(21) Appl. No.: 14/632,998

(22) Filed: Feb. 26, 2015

(65) Prior Publication Data

US 2016/0254047 A1    Sep. 1, 2016

(51) Int. Cl.
*G11C 16/00* (2006.01)
*G11C 11/56* (2006.01)
G11C 16/34 (2006.01)
G11C 16/04 (2006.01)
G11C 16/32 (2006.01)

(52) U.S. Cl.
CPC ........ *G11C 11/5642* (2013.01); *G11C 11/5628* (2013.01); *G11C 11/5671* (2013.01); *G11C 16/3459* (2013.01); *G11C 16/0458* (2013.01); *G11C 16/32* (2013.01); *G11C 16/34* (2013.01); *G11C 16/3436* (2013.01); *G11C 16/3454* (2013.01); *G11C 2211/5621* (2013.01)

(58) Field of Classification Search
CPC ............. G11C 11/5642; G11C 11/5628; G11C 11/5671; G11C 16/0458; G11C 16/32; G11C 16/34; G11C 16/3436; G11C 16/3454; G11C 16/3459; G11C 2211/5621

USPC .......... 365/185.03, 185.22, 185.28
See application file for complete search history.

(56) References Cited

U.S. PATENT DOCUMENTS

| | | | | |
|---|---|---|---|---|
| 5,768,188 | A | * | 6/1998 | Park .................... G11C 11/5621 365/185.03 |
| 5,774,397 | A | * | 6/1998 | Endoh ................. G11C 11/5621 365/185.03 |
| 6,091,631 | A | * | 7/2000 | Kucera ............... G11C 11/5621 365/185.03 |
| 7,224,614 | B1 | | 5/2007 | Chan |
| 7,525,838 | B2 | * | 4/2009 | Jung ................... G11C 11/5628 365/185.03 |
| 8,582,381 | B2 | | 11/2013 | Oowada |
| 8,824,211 | B1 | | 9/2014 | Costa |
| 8,885,416 | B2 | | 11/2014 | Mui |
| 8,929,142 | B2 | | 1/2015 | Dong |
| 2006/0158935 | A1 | * | 7/2006 | Chan ..................... G11C 7/062 365/185.17 |

(Continued)

OTHER PUBLICATIONS

PCT International Search Report dated Mar. 4, 2016, PCT Patent Application No. PCT/US2015/061666.
Dutta, et al., U.S. Appl. No. 14/525,691, filed Oct. 28, 2014.

*Primary Examiner* — Tan T. Nguyen
(74) *Attorney, Agent, or Firm* — Vierra Magen Marcus LLP

(57) ABSTRACT

A non-volatile storage system includes a plurality of non-volatile storage elements arranged in two dimensional or three dimensional structures. The system applies programming to the non-volatile storage elements and performs verification of the programming. The verification includes performing a multi-strobe sensing operation to test for multiple data states while applying a common word line voltage.

21 Claims, 19 Drawing Sheets

(56) References Cited

U.S. PATENT DOCUMENTS

| | | | |
|---|---|---|---|
| 2008/0112230 A1 | 5/2008 | Mokhlesi | |
| 2011/0273935 A1* | 11/2011 | Dong | G11C 11/5642 |
| | | | 365/185.22 |
| 2012/0314499 A1* | 12/2012 | Yuan | G11C 16/26 |
| | | | 365/185.11 |
| 2013/0223155 A1 | 8/2013 | Oowada | |
| 2014/0071761 A1 | 3/2014 | Sharon | |
| 2014/0226406 A1 | 8/2014 | Dong | |
| 2014/0380108 A1* | 12/2014 | Goldman | G06F 11/1048 |
| | | | 714/721 |

* cited by examiner

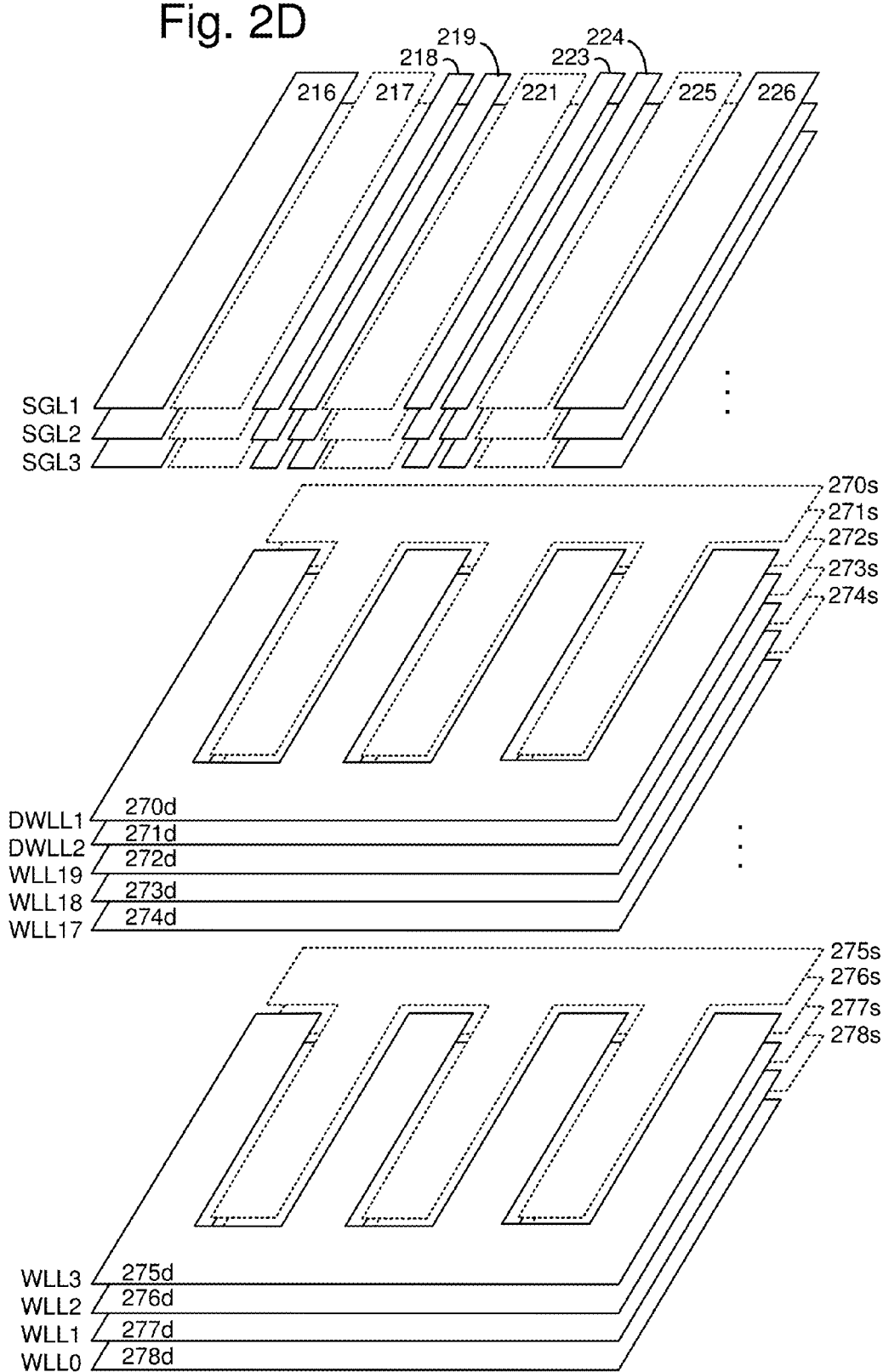

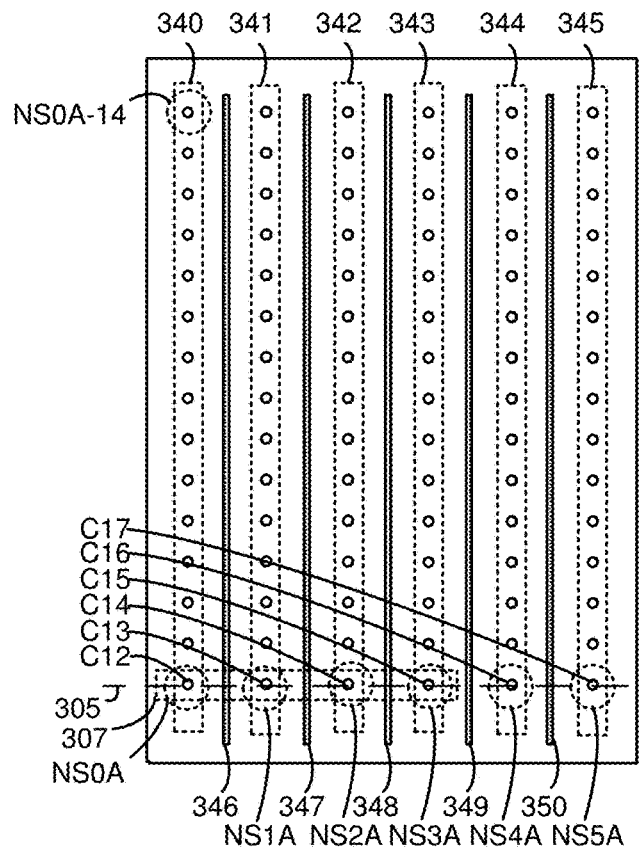
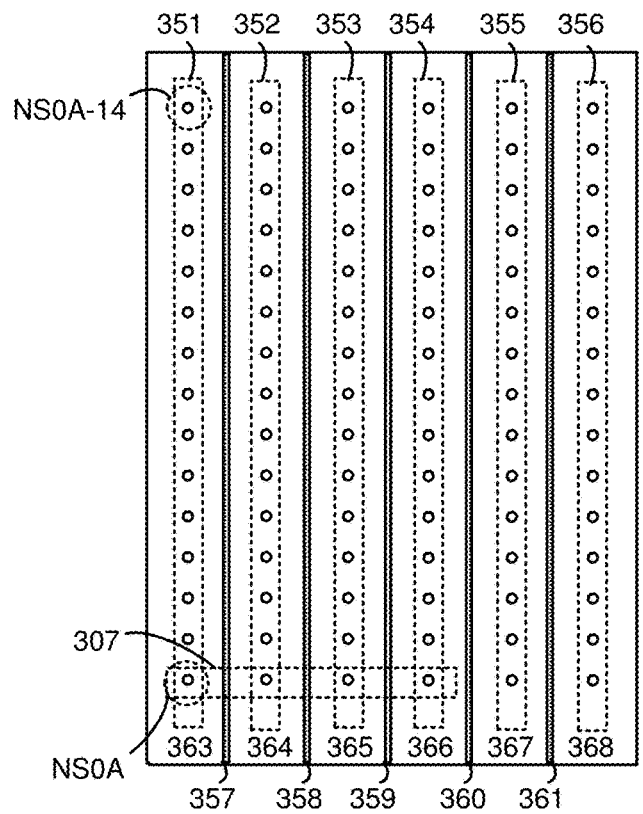

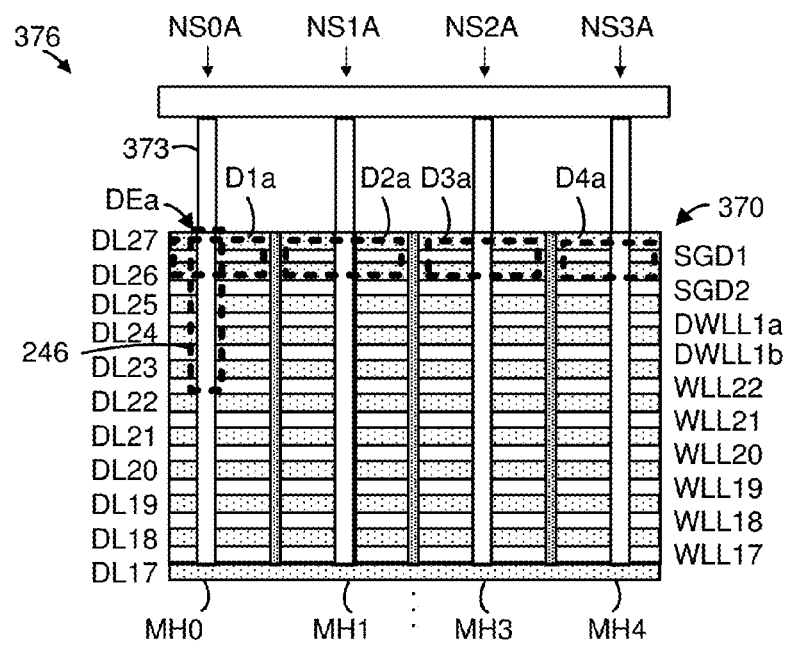
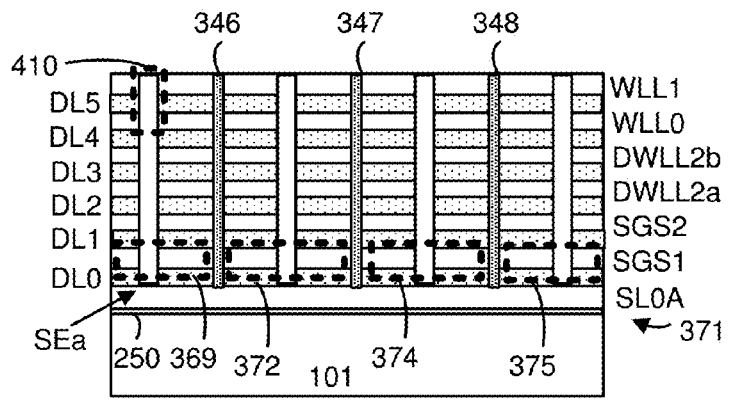
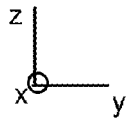
Fig. 3C1
Fig. 3C2

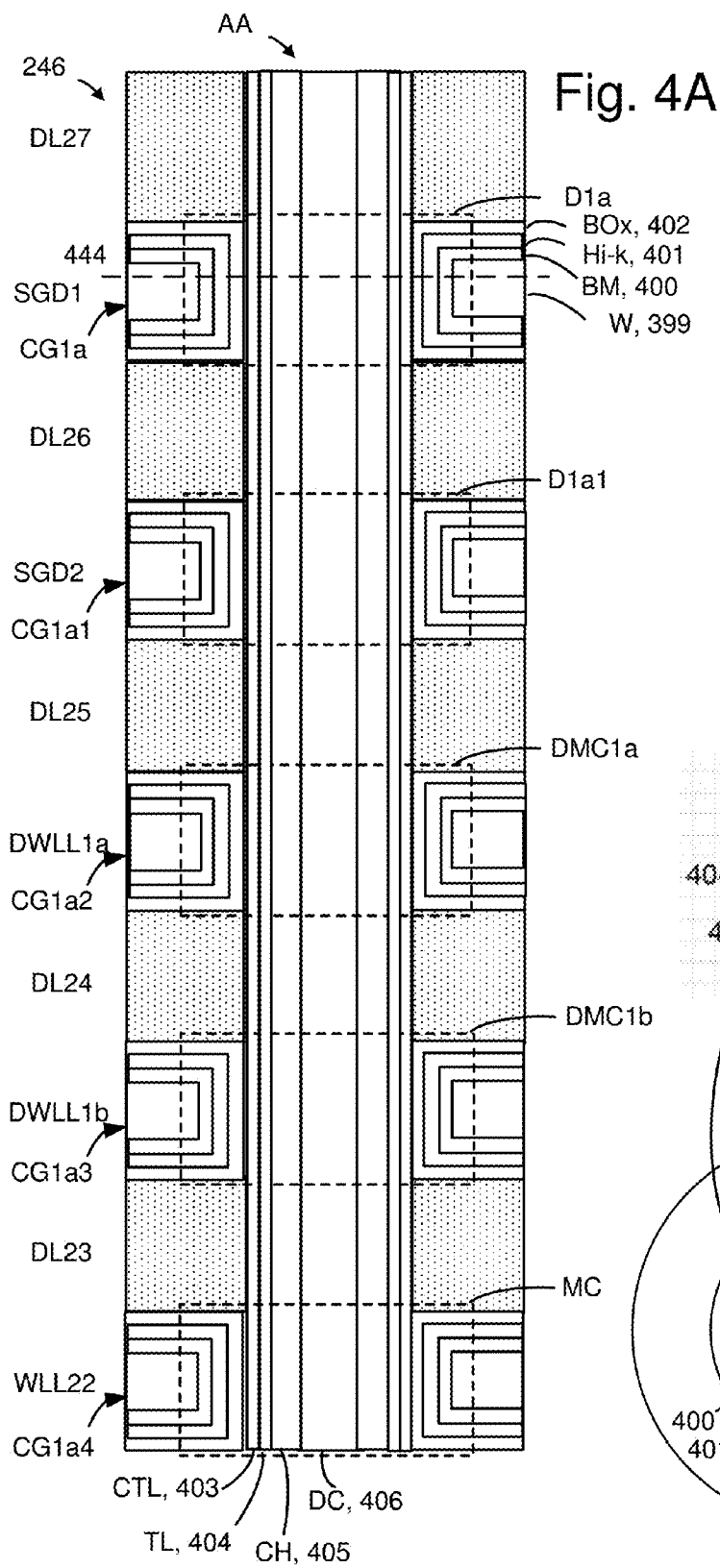
Fig. 4A
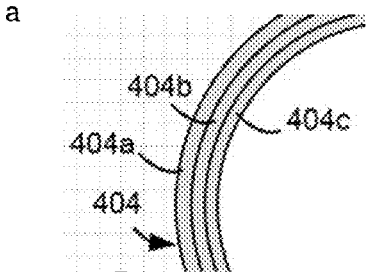
Fig. 4B2
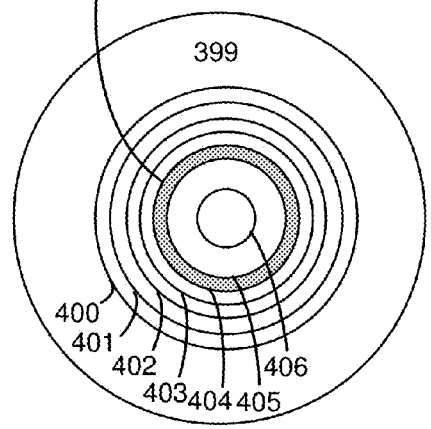
Fig. 4B1

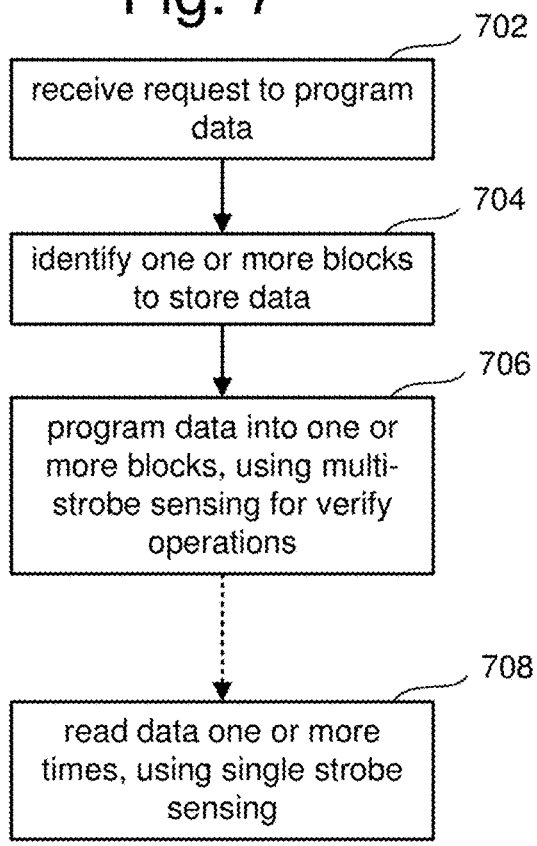

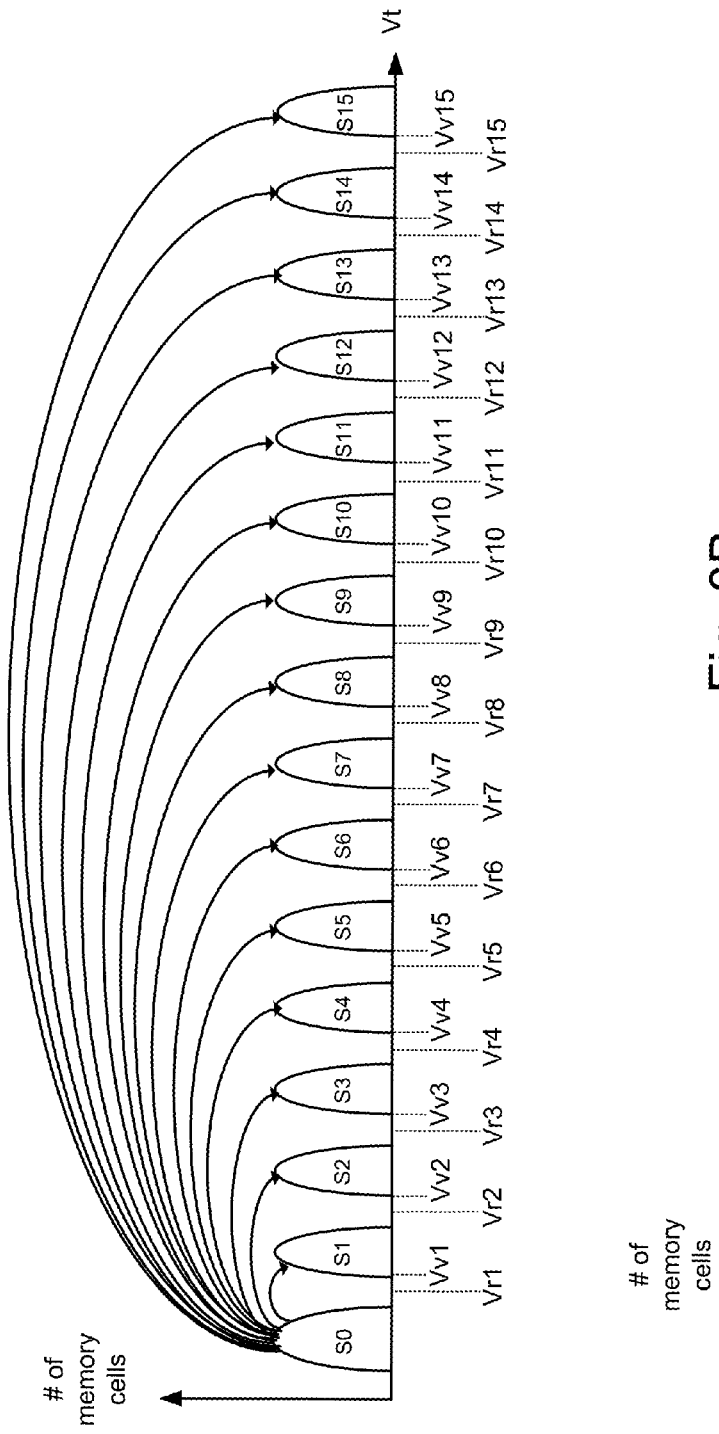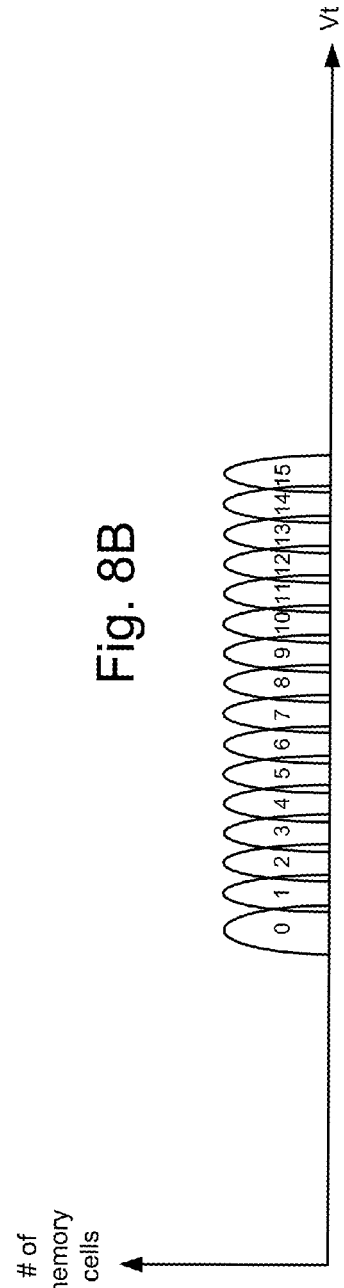

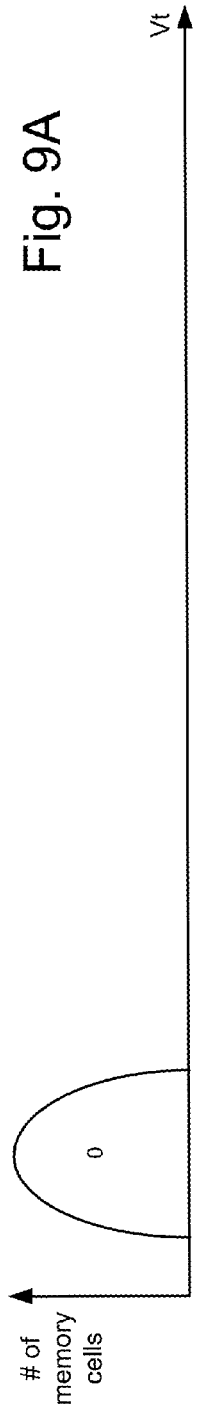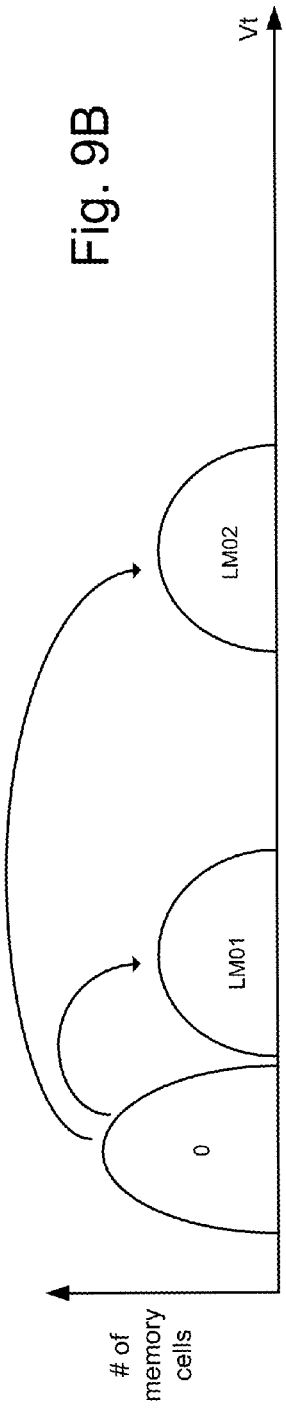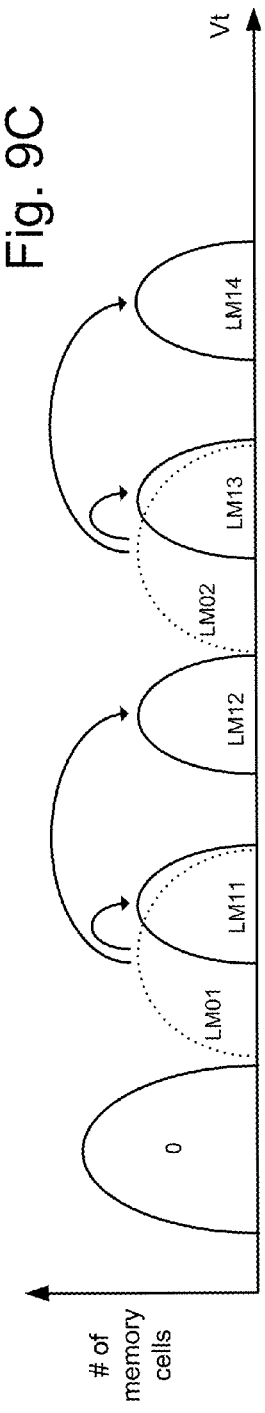

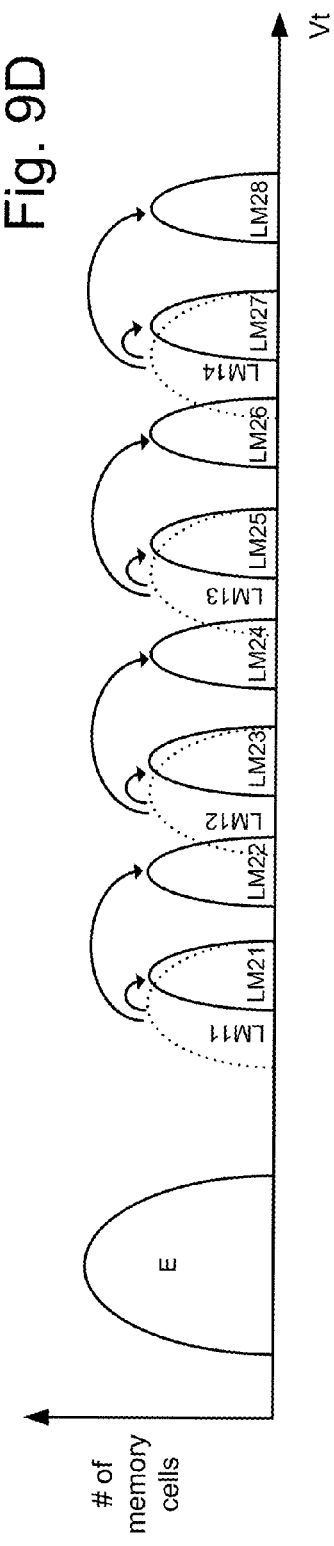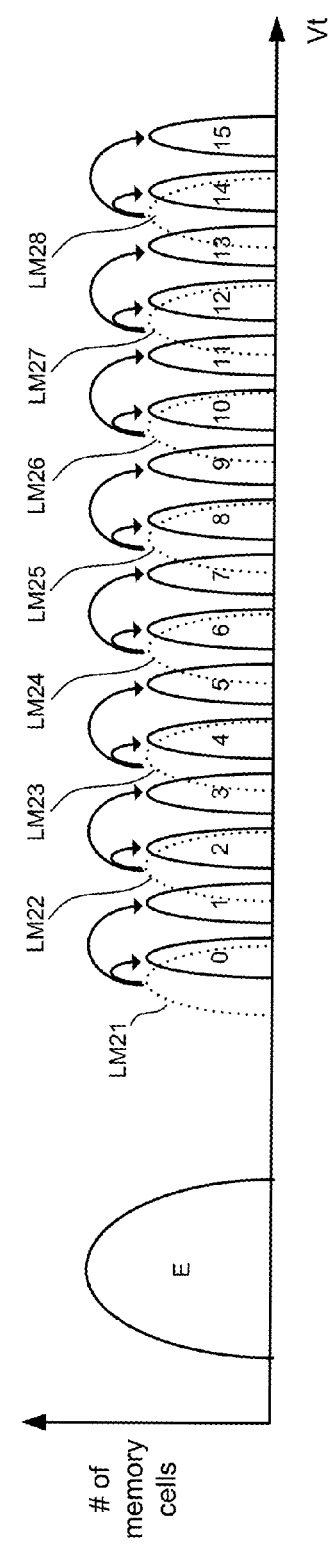

PROGRAM VERIFY FOR NON-VOLATILE STORAGE

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

The memory cells can be used to store two ranges of charges and, therefore, the memory cell can be programmed/erased between two data states (an erased state and a programmed state). Such a flash memory device is sometimes referred to as a binary memory device.

A multi-state memory device stores multiple bits of data per memory cell by identifying multiple distinct valid threshold voltage distributions (or data states) separated by forbidden ranges. Each distinct threshold voltage distribution corresponds to a predetermined value for the set of data bits encoded in the memory device. For example, a memory cell that stores two bits of data uses four valid threshold voltage distributions. A memory cell that stores four bits of data uses sixteen valid threshold voltage distributions.

As the number of bits of data per memory cell (and, therefore, the number of valid threshold voltage distributions) are increased, the data capacity of a memory device increases. However, the time needed for programming also increases. For example, the greater the number of valid threshold voltage distributions, the greater the number of verify operations needed between program pulses.

BRIEF DESCRIPTION OF THE DRAWINGS

Like-numbered elements refer to common components in the different figures.

FIG. 2D depicts an alternative view of the select gate layers and word line layers of the stack 231 of FIG. 2C.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where two SGD layers, two SGS layers and dummy word line layers DWLL1a, DWLL1b, DWLL2a and DWLL2b are provided.

FIG. 3C2 depicts a variation in the width of a memory hole along its height.

FIG. 4A depicts a view of the region 246 of FIG. 3C1, showing SGD transistors D1a (consistent with FIG. 3C1) and Di1 above dummy memory cells DMC1a and DMC1b and a data memory cell MC.

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 7 is a flow chart describing one embodiment of a process for operating a non-volatile storage system.

FIG. 8A depicts a set of threshold voltage distributions.

FIG. 8B depicts a set of threshold voltage distributions.

FIGS. 9A, 9B, 9C, 9D and 9E depict threshold voltage distributions and illustrate a multi-stage programming process.

DETAILED DESCRIPTION

To increase performance during programming, a non-volatile storage system is proposed that verifies the programming of memory cells by performing a multi-strobe sensing operation to test for multiple data states while applying a common word line voltage.

The following discussion provides details of the structure of example memory devices which can implement the proposed technology for increasing performance.

Figure 1A:
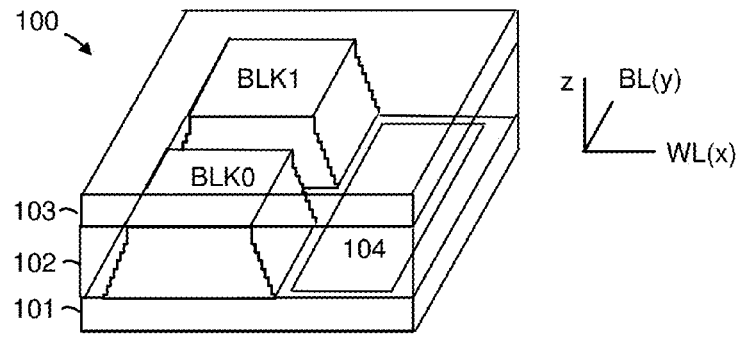
FIG. 1A is a perspective view of a 3D stacked non-volatile memory device.

FIG. 1A is a perspective view of a 3D stacked non-volatile memory device. The memory device 100 includes a substrate 101. On and above the substrate are example blocks BLK0 and BLK1 of memory cells (non-volatile storage elements). Also on the substrate is a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions. Additionally, note that components are considered to be connected if they are directly connected or indirectly connected.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
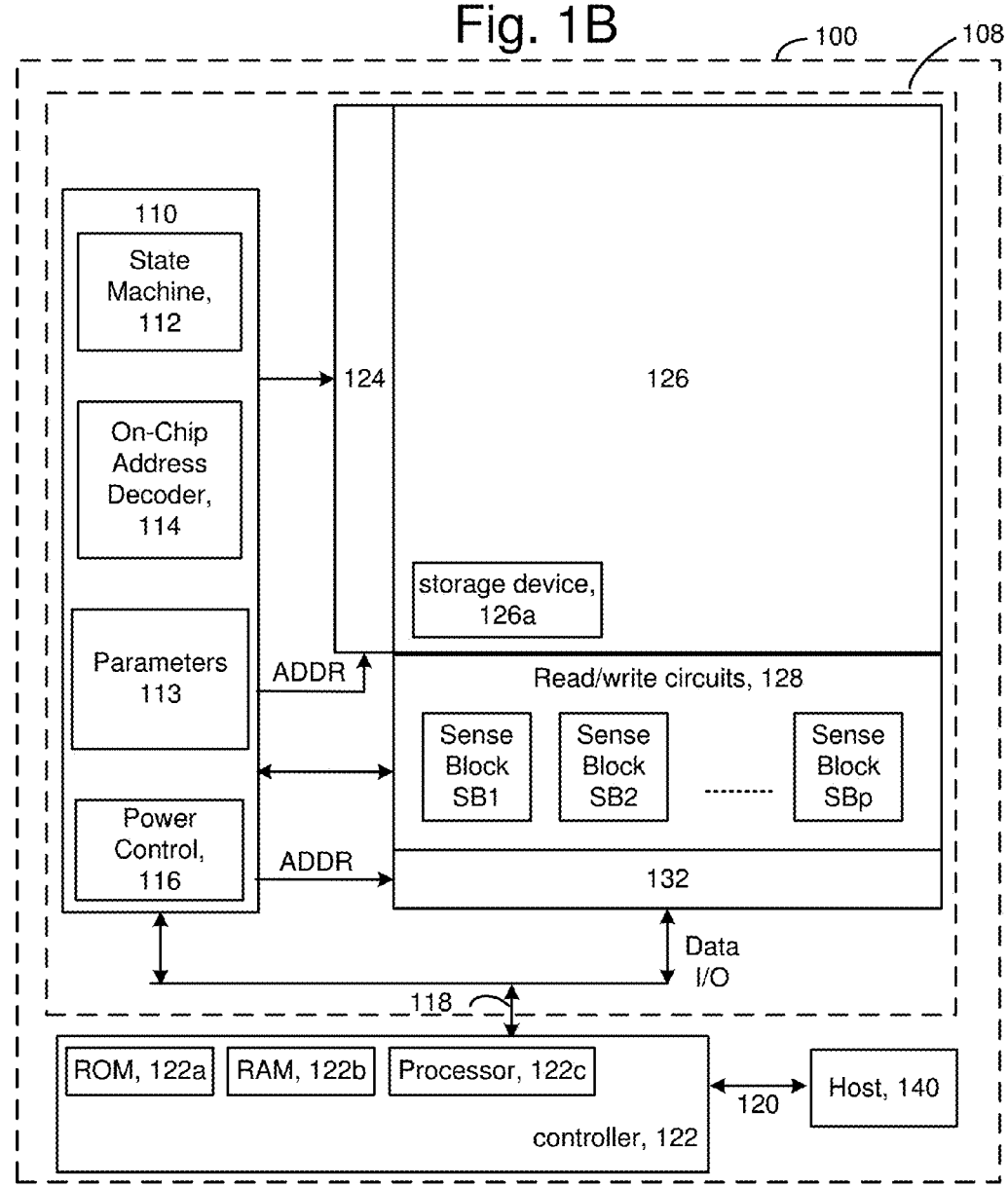
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. In some embodiments, one controller will communicate with multiple memory die. Commands and data are transferred between the host 140 and controller 122 via a data bus 120 and between the controller and the one or more memory die 108 via lines 118.

Memory structure 126 can be a two dimensional structure or a three dimensional structure of memory cells (e.g., NAND flash memory cells). The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. Parameter storage 113 may be provided for storing operational parameters The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string. In various embodiments, one or more of control circuitry 110, state machine 112, decoders 114/124/132, power control module 116, sense blocks SB1, SB2, . . . , SBp, read/write circuits 128, and controller 122 can be thought of as at least one or more control circuits which are configured to perform the functions described herein.

The off-chip controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device 126a of the memory structure, such as a reserved area of memory cells in one or more word lines.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND flash memory) typically contain memory elements connected in series. A NAND string is an example of a set of series-connected transistors comprising memory cells and select gate transistors.

A NAND flash memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2A:
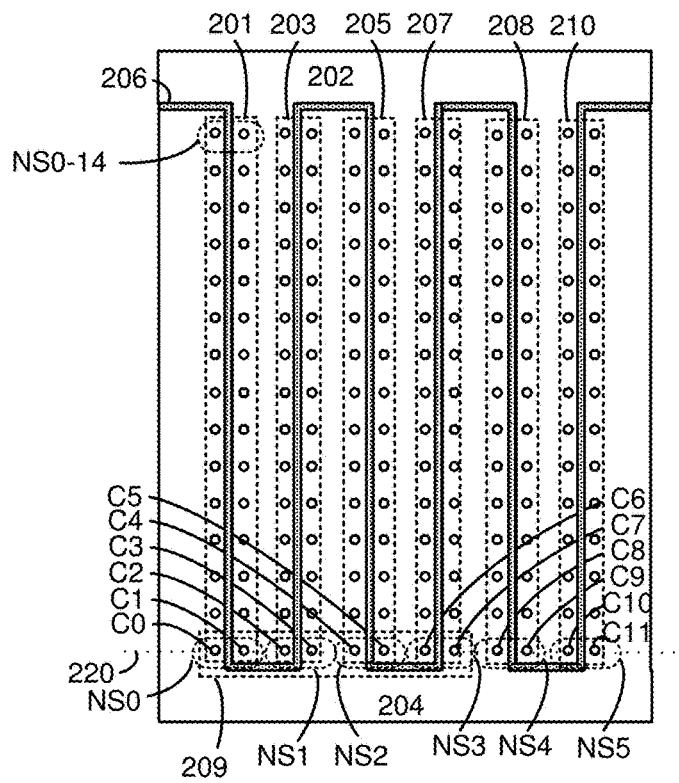
FIG. 2A depicts a top view of example word line layers 202 and 204 in a U-shaped NAND embodiment, as an example implementation of BLK0 in FIG. 1A.

FIG. 2A depicts a top view of example word line layers 202 and 204 in a U-shaped monolithic 3D NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data word line layers WLL0 to WLL19, dummy word line layers DWLL1 and DWLL2, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

As mentioned, a dummy memory cell, also referred to as a non-data memory cell, does not store data, while a data memory cell is eligible to store data. Thus, data memory cells may be programmed to store write data. After a block is erased, all data memory cells are in the erased state. As some word lines are programmed, the corresponding data memory cells store data while other data memory cells do not store data. As a remainder of the block is programmed, all data memory cells typically store data.

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000×24=9,216,000 memory cells in the set.

Figure 2B:
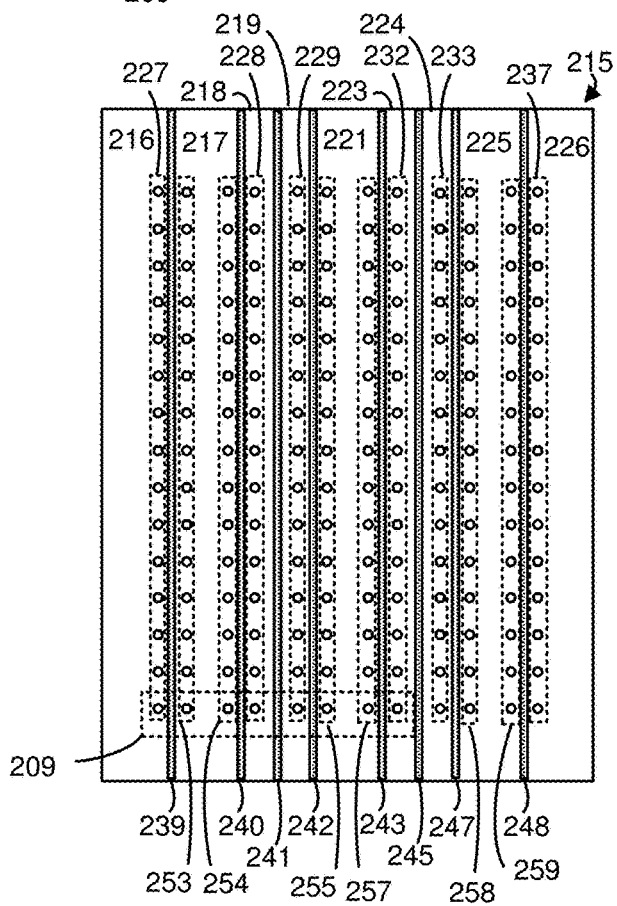
FIG. 2B depicts a top view of example select gate layer portions, consistent with FIG. 2A.
Figure 2C:
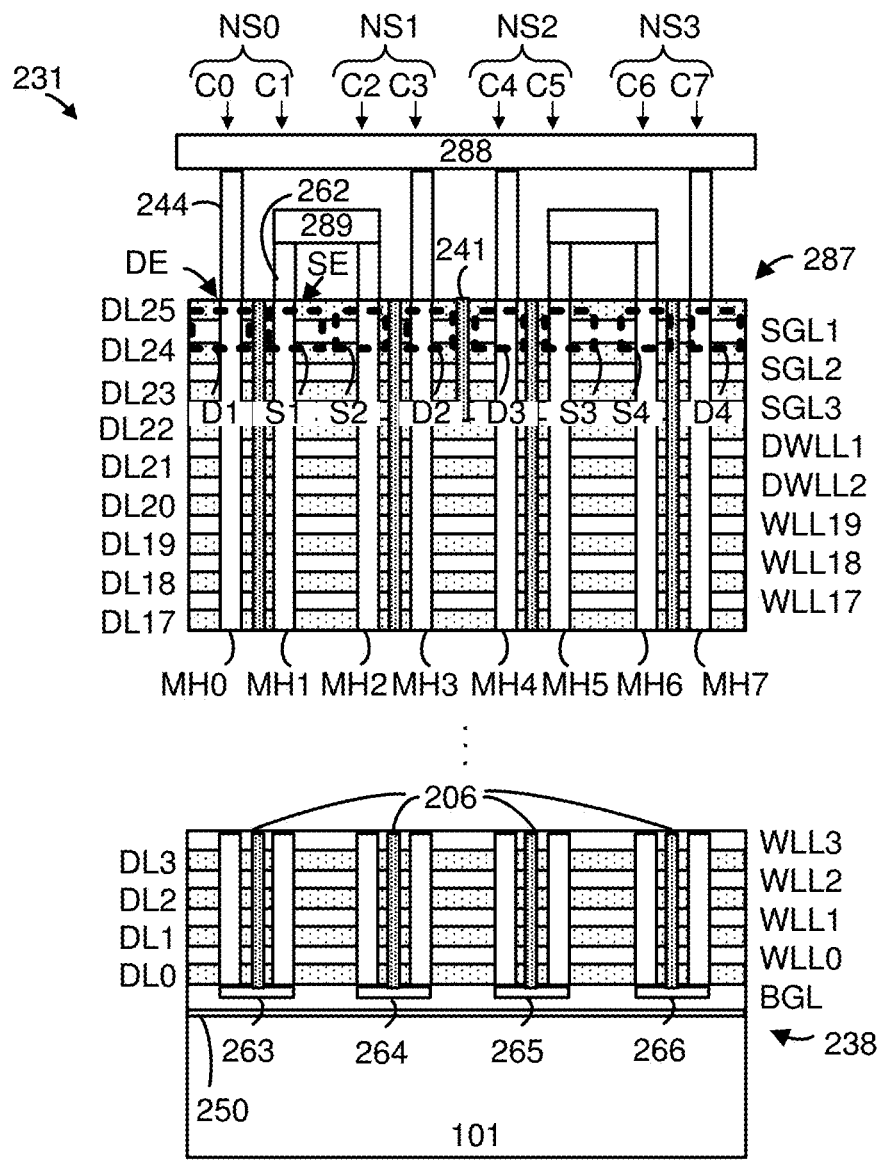
FIG. 2C depicts an embodiment of a stack 231 showing a cross-sectional view of the portion 209 of FIG. 2A, along line 220, where three select gate layers, SGL1, SGL2 and SGL3 are provided.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

FIG. 3A depicts a top view of an example word line layer 304 of the block BLK0 of FIG. 1A, in a straight NAND string monolithic 3D embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where two SGD layers, two SGS layers and four dummy word line layers DWLL1a, DWLL1b, DWLL2a and DWLL2b are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A. A region 410 of the stack is shown in greater detail in FIG. 4C. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (e.g., MH0-MH4) in the memory device, and a width of the vertically-extending memory holes varies along a height of the memory device.

Figure 3D:
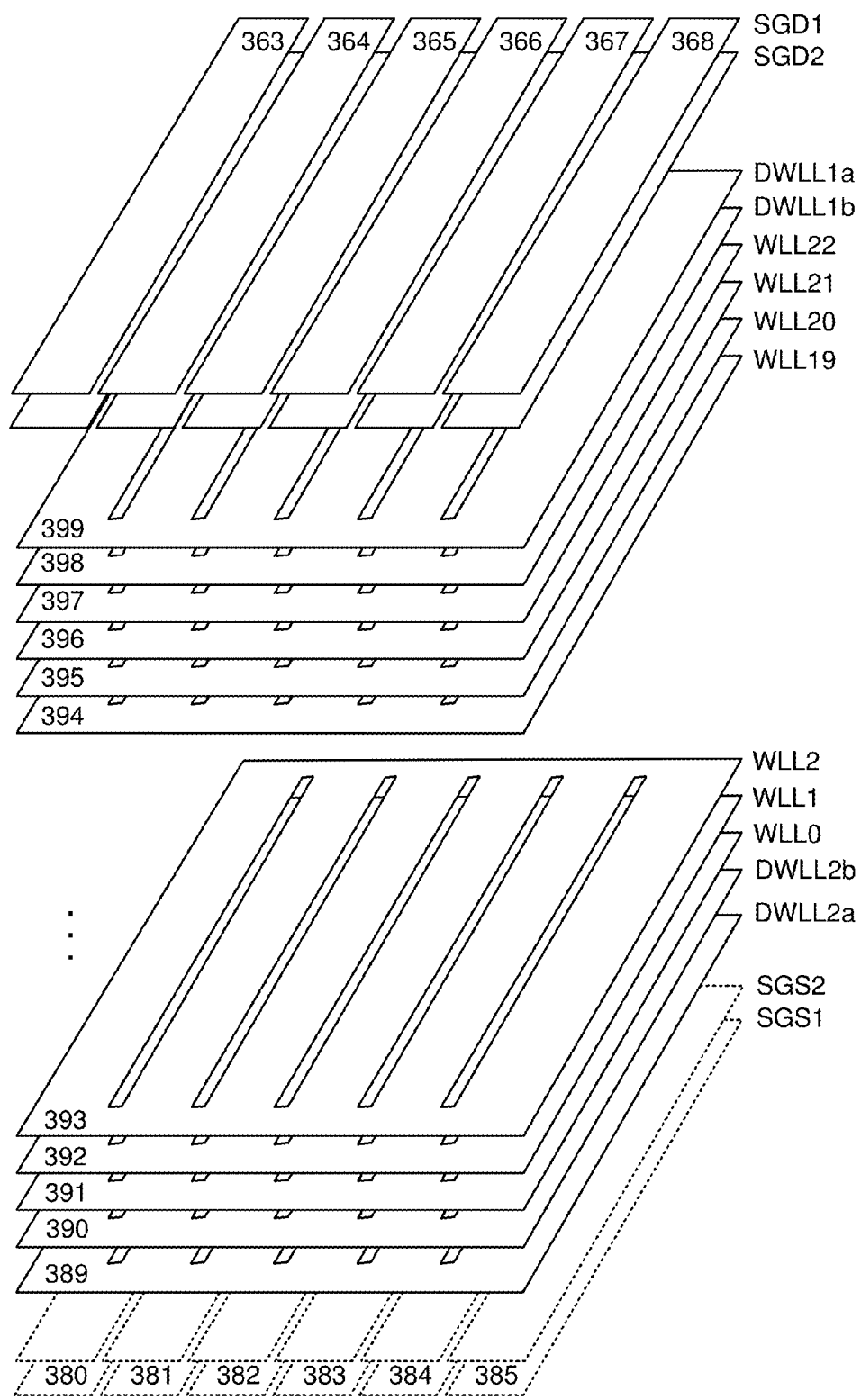
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL1a, DWLL1b, WLL22, WLL21, WLL20 and WLL19 represent word lines 399, 398, 397, 396, 395 and 394, respectively. WLL2, WLL1, WLL0, DWLL2b and DWLL2a represent word lines 393, 392, 391, 390 and 389, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a (consistent with FIG. 3C1) and Dia1 above dummy memory cells DMC1a and DMC1b and a data memory cell MC. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a and Dia1, the dummy memory cell DMC1a and DMC1b, and the memory cell MC, respectively. In another approach, all of these layers except the metal are provided in the column Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B 1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

Figure 5A:
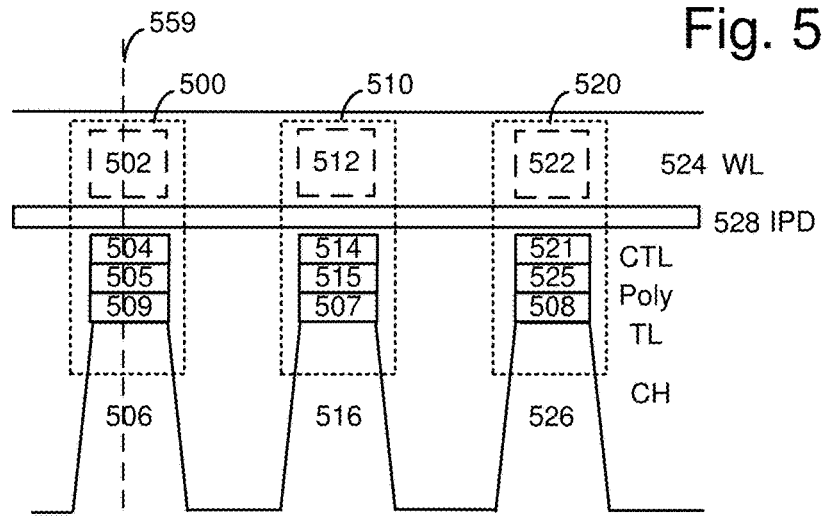
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example embodiment of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel ling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
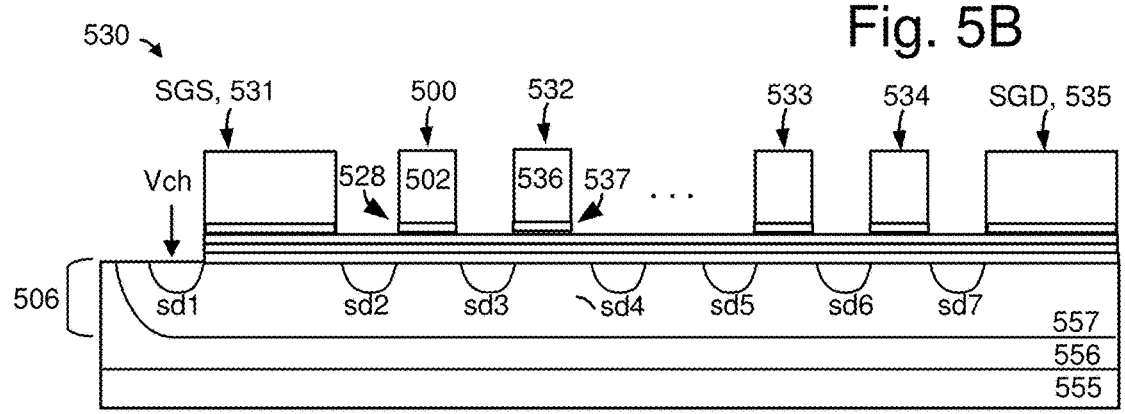
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example memory cells 500, 532, . . . , 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the memory cells but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

One or more dummy memory cells may be provided adjacent to the select gate transistors.

Figure 6A:
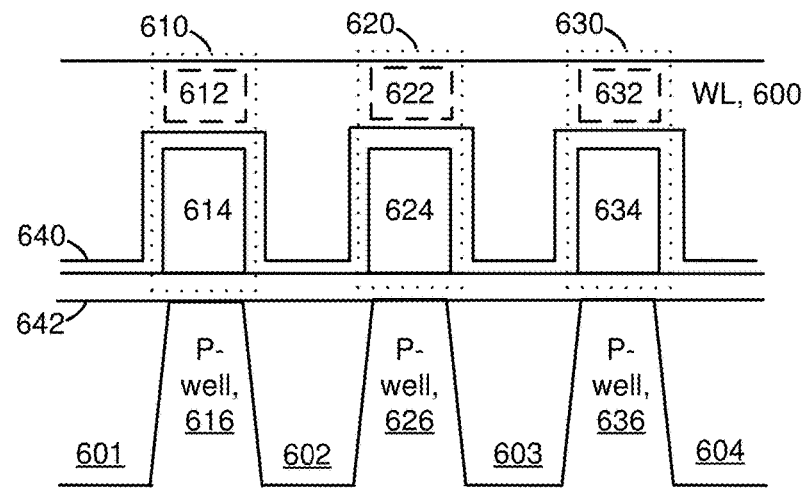
FIG. 6A depicts a cross-sectional view in a word line direction of memory cells comprising floating gates as another 2D example of memory cells in the memory structure 126 of FIG. 1B.

FIG. 6A depicts a cross-sectional view in a word line direction of memory cells comprising floating gates as another 2D example embodiment of memory cells in the memory structure 126 of FIG. 1B. The cross section depicts a control gate (CG) or word line 600 which extends across multiple memory cells in a word line direction. Each memory cell includes a control gate and a floating gate (FG) which is over a respective channel area of the substrate, typically in a p-well. For example, memory cells 610, 620 and 630 include control gates 612, 622 and 632, respectively, and floating gates 614, 624 and 634, over p-well channel regions 616, 626 and 636, respectively. Each channel region is part of a NAND string which can be visualized as coming out of the page, in a bit line direction which is orthogonal to the word line direction. The p-well regions are separated by shallow trench isolation regions 601, 602, 603 and 604. An inter-poly dielectric (IPD) material 640 may be provided between each control gate and floating gate, while a tunnel oxide layer 642 is provided between each floating gate and a substrate region.

Figure 6B:
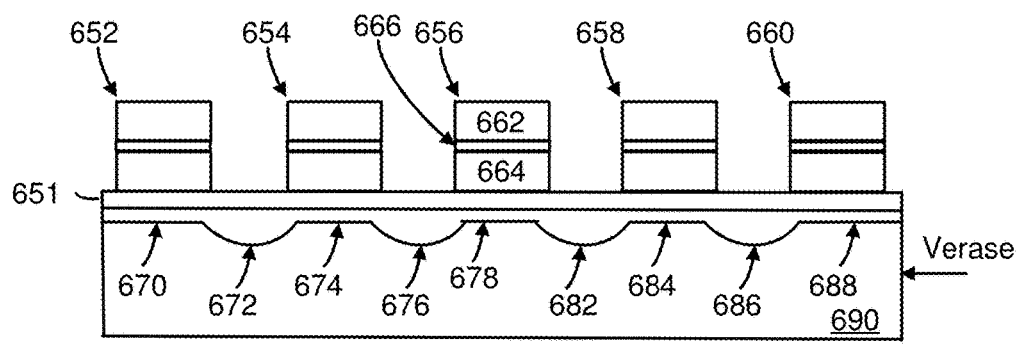
FIG. 6B depicts a cross-sectional view of the NAND string of FIG. 6A.

FIG. 6B depicts a cross-sectional view of a NAND string of FIG. 6A. The NAND string includes example memory cells 652, 654, 656, 658 and 660 formed on a tunnel oxide 651 on substrate 690. The memory cells include a control gate, floating gate and inter-poly dielectric (IPD). For example, the memory cell 656 has a control gate 662, IPD 666 and floating gate 664. During an erase operation, conductive channel regions are formed under the memory cells. Specifically, a conductive channel region 670 forms under the memory cell 652 between the source/drain region 672 and another source/drain region, not shown, a conductive channel region 674 forms under the memory cell 654 between the source/drain regions 672 and 676, a conductive channel region 678 forms under the memory cell 656 between the source/drain regions 676 and 682, a conductive channel region 684 forms under the memory cell 658 between the source/drain regions 682 and 686, and a conductive channel region 688 forms under the memory cell 660 between the source/drain region 686 and another source/drain region, not shown. An erase voltage, Verase, is applied to the substrate 690.

FIG. 7 is a flow chart describing one embodiment of a process for operating a non-volatile storage system, including any of the systems described or referred to above. In step 702, a request for programming is received from the Host, the Controller or other entity. In step 704, the Controller (or state machine or other entity) will determine which set of one or more blocks to store the data. In step 706, the data received for the request is programmed into one or more blocks of memory cells. In step 708, the data can be read. The dashed line between steps 706 and 708 indicates that there can be an unpredictable amount of time between programming and reading.

In one example implementation of programming, memory cells are preprogrammed in order to maintain even wear on the memory cells. In one implementation, the memory cells are preprogrammed to the highest data state, a random pattern, or any other pattern. In some implementations, pre-programming need not be performed. Some embodiments do not implement pre-programming. After pre-programming, memory cells are erased (in blocks or other units) and then programmed.

At the end of a successful programming process (with verification), the threshold voltages of the memory cells should be within one or more distributions of threshold voltages for programmed memory cells or within a distribution of threshold voltages for erased memory cells, as appropriate.

FIG. 8 illustrates example threshold voltage distributions for the memory cell array when each memory cell stores four bits of data. Other embodiments, however, may use other data capacities per memory cell (e.g., such as one, two, three, or five bits of data per memory cell). FIG. 8A shows sixteen threshold voltage distributions (corresponding to sixteen data states). The first threshold voltage distribution (data state) S0 represents memory cells that are erased. The other fifteen threshold voltage distributions (data states) S1-S15 represent memory cells that are programmed. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected.

FIG. 8A also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (ie S0, S1, S2, S3, . . . ) the memory cell is in.

FIG. 8A also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S(, S10, S11, S12, S13, S14 and/or S15. For example, while some memory cells are being programmed from data state S0 to data state S1, other memory cells are being programmed from data state S0 to data state S2 and/or from data state S0 to data state S3, and so on. The arrows of FIG. 8A represent the full sequence programming.

FIG. 8B illustrates that another embodiment of threshold voltage distributions corresponding to data states S0-S15 that can partially overlap since the ECC can handle a certain percentage of cells that are in error. Because of the size of the drawing, the references to the data states have been truncated such that 0 is used rather than S1, 1 is used rather than S1, 2 is used rather than S2, and so on.

FIGS. 9A-D describe a four stage programming process for programming data into memory cells that store four bits of data. Prior to programming, all of the memory cells for a block will be erased into an erased threshold voltage distribution. For example, FIG. 9A shows a block of memory cells in an erased threshold voltage distribution (data state) S0 (depicted as 0, as per explanation above). In some embodiments, erased threshold voltage distribution (data state) 0 is below zero volts. In other embodiments, erased threshold voltage distribution (data state) 0 is above zero volts, or partially above zero volts.

The first programming stage is depicted in FIG. 9B. During the first programming pulse, those memory cells that are to be eventually programmed to data states 0 through 7 will be programmed to a low threshold voltage distribution which is below the threshold voltage distribution for state 0. For example, FIG. 9B shows those memory cells being programmed to intermediate threshold voltage distribution LM01. The group of memory cells that are to be eventually programmed to data states 8 through 15 will be programmed to an intermediate threshold voltage distribution labeled LM02 on FIG. 9B. In one embodiment, threshold voltage distribution LM02 is not greater than the threshold voltages for data state 7. Between programming pulses of this first stage, two verify operations are performed: one for LM01 and one for LM02. Thus, between program pulses, two verify pulses will be used. It may be possible to only use one verify pulse (for LM01 only) at the beginning of the program process until at least one memory cell has reached LM01, at which time the system will use two verify pulses. In other embodiments, the first programming pass can program to more than two threshold voltage distributions. In one embodiment, data is erased to state 0 and memory cells that are to be eventually programmed to data states 8 through 15 will be programmed to an intermediate threshold voltage distribution, while memory cells that are to be eventually programmed to data states 0 through 7 will remain in state 0. In another embodiment, LM01 can slightly overlap with the erased threshold voltage distribution E since the ECC can handle a certain percentage of memory cells that are in error. Thus, the programming pass can end when all but K bits have verified, with K being a number that can be corrected by ECC.

The second programming stage is depicted in FIG. 9C. Those memory cells that are to be programmed to data states 0 through 3 will be programmed from LM01 to threshold voltage distribution LM11. For example, FIG. 9C shows threshold voltage distributions LM01 (dotted) and LM11 (solid line). Memory cells that are to be eventually programmed to data states 3 through 7 will be programmed from LM01 to intermediate threshold voltage distribution LM12. Memory cells that are to eventually be programmed to data states 8 through 11 will be programmed from LM02 to intermediate threshold voltage distribution LM13. Those memory cells that are eventually to be programmed to data states 12 through 15 will be programmed from LM02 to intermediate threshold voltage distribution LM14. During the second programming stage, up to four verify operations need to be performed between programming pulses: one verify operation for LM11, one verify operation for LM12, one verify operation for LM13 and one verify operation for LM14. Therefore, between each programming pulse, there will be up to four verify pulses. It may be possible, in some embodiments, to reduce the number of verify pulses by using an intelligent scheme for determining when it is possible to omit some of the verify pulses because no memory cells could be near a particular target. Various schemes can be used. More information about efficient verification schemes can be found in U.S. Pat. No. 7,073,103, incorporated herein by reference in its entirety. Because the ECC can handle a certain percentage of memory cells that are in error, in another embodiment LM11 can overlap with LM12 and LM13 can overlap with LM14. Additionally, LM12 can overlap with LM01 or LM02, and LM14 can overlap with LM02. Thus, the programming stage can end when all but K bits have verified, with K being a number that can be corrected by ECC.

The third programming stage is depicted in FIG. 9D. Those memory cells that are eventually to be programmed to data state 0 and 1 will be programmed from LM11 to intermediate threshold voltage distribution LM21. Those memory cells that will be programmed to data states 2 and 3 are programmed from LM11 to intermediate threshold voltage distribution LM22. Those memory cells that are to be programmed to data states 4 and 5 are programmed from LM12 to intermediate threshold voltage distribution LM23. Those memory cells that are to be programmed to data states 6 and 7 are programmed from LM12 to intermediate threshold voltage distribution LM24. Those memory cells that are to be programmed to data states 8 and 9 are programmed from LM13 to intermediate threshold voltage distribution LM25. Those data cells that are to be programmed to data states 10 and 11 are programmed from LM13 to intermediate threshold voltage distribution LM26. Those data cells that are to be programmed to data states 12 and 13 are programmed from LM14 to intermediate threshold voltage distribution LM27. Those memory cells that are to be programmed to data states 14 and 15 are programmed from LM14 to intermediate threshold voltage distribution LM28. Because the ECC can handle a certain percentage of memory cells that are in error, in another embodiment neighboring LM2x distributions can overlap with each other (e.g., LM26 can overlap with LM25). Additionally, LM2x distributions can also overlap with LM1x distributions (e.g., LM26 can overlap with LM13). Thus, the programming pass can end when all but K bits have verified, with K being a number that can be corrected by ECC.

The fourth (and final) programming stage is depicted in FIG. 9E. In the fourth programming pass, memory cells to be programmed to data state 0 are programmed from LM21 to data state 0. Memory cells to be programmed to data state 1 are programmed from LM21 to data state 1. Memory cells to be programmed to data state 2 are programmed from LM22 to data state 2. Memory cells to be programmed to data state 3 are programmed from LM22 to data state 3. Memory cells that are to be programmed to data state 4 are programmed from LM23 to data state 4. Memory cells that are to be programmed to data state 5 are programmed from LM23 to data state 5. Memory cells to be programmed to data state 6 are programmed from LM24 to data state 6. Memory cells that are to be programmed to data state 7 are programmed from LM24 to data state 7. Memory cells that are to be programmed to data state 8 are programmed from LM25 to data state 8. Memory cells that are to be programmed to data state 9 are programmed from LM25 to data state 9. Memory cells that are to be programmed to data state 10 are programmed from LM26 to data state 10. Memory cells that are to be programmed to data state 11 are programmed from LM26 to data state 11. Memory cells that are to be programmed to data state 12 are programmed from LM27 to data state 12. Memory cells that are to be programmed to data state 13 are programmed from LM27 to data state 13. Memory cells that are to be programmed to data state 14 are programmed from LM28 to data state 14. Memory cells that are to be programmed to data state 15 are programmed from LM28 to data state 15. As discussed above, another embodiment includes data states 0-15 overlapping at the end of the programming process. Other embodiments may include intermediate LM states that overlap with one another, especially if the binary version of the data remains until the entire block goes through the entire programming sequence. Other variations of the four stage programming process can also be used. Additionally, other multi-stage programming processes can also be used.

Figure 10:
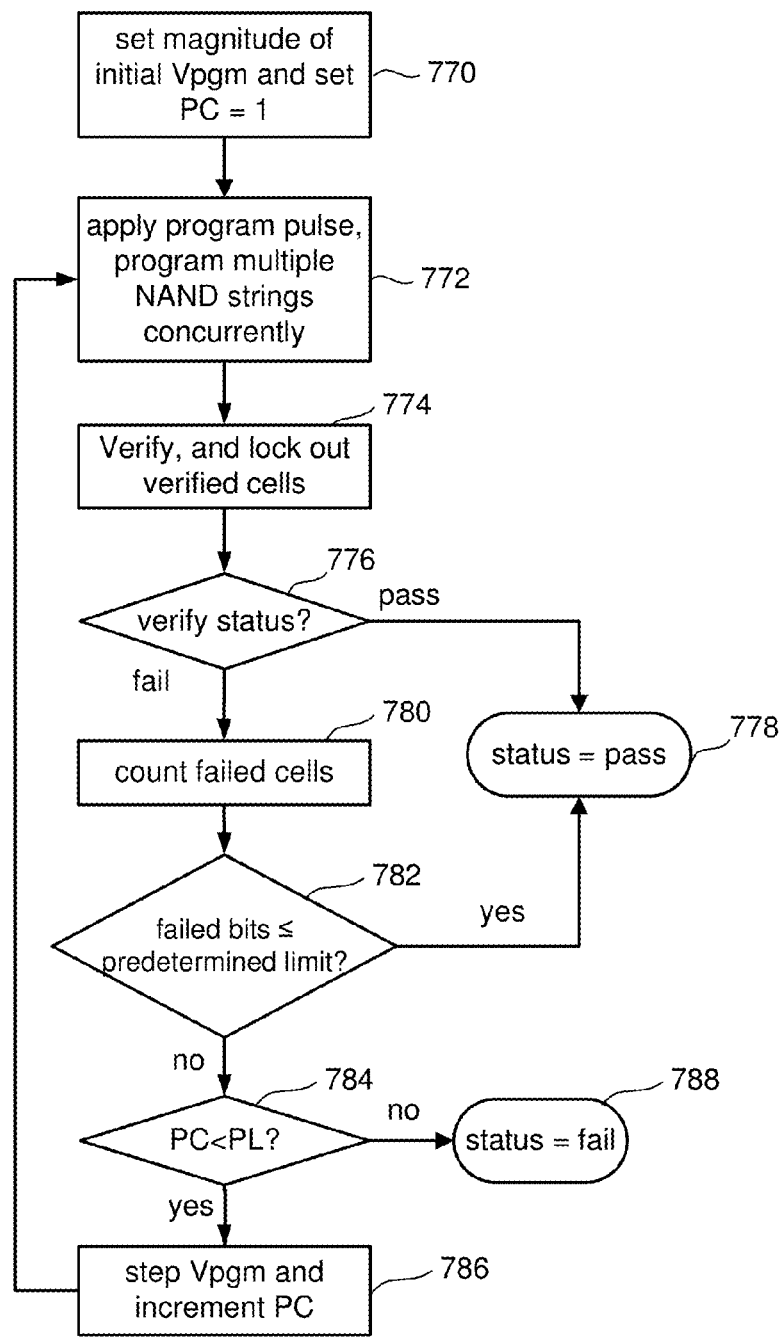
FIG. 10 is a flow chart describing one embodiment of a process for programming non-volatile storage.

FIG. 10 is a flow chart describing one embodiment of a process for performing programming on memory cells to one or more targets (e.g., data states or threshold voltage ranges). The process of FIG. 10 can be performed one or multiple times during step 708 of FIG. 7. For example, the process of FIG. 10 can be used to program memory cells from erased data state S0 to programmed data states S1-S15 as part of performing a full sequence programming process. The process of FIG. 10 can be used to any stage of the multi-stage programming process of FIGS. 9A-E. In one embodiment, the process of FIG. 10 is performed at the direction of state machine 112. In other embodiments, other control circuits can be used.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 770 of FIG. 10, the programming voltage (Vpgm) is initialized to the starting magnitude and a program counter PC maintained by state machine 112 is initialized at 1. In step 772, a program pulse of the program signal Vpgm is applied to the selected word line (the word line selected for programming) In step 772, the program pulse is concurrently applied to multiple memory cells connected to the selected word line. In step 774, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, Vv7, Vv8, Vv9, Vv10, Vv11, Vv12, Vv13, Vv14 and Vv15). In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780 of FIG. 10, the system counts the number of memory cells that have not yet reached their respective target threshold voltage distribution. That is, the system counts the number of cells that have failed the verify process. This counting can be done by the state machine, the controller, or other logic. In step 782, it is determined whether the count from step 780 is less than or equal to a predetermined limit. In one embodiment, the predetermined limit is the number of bits that can be corrected by ECC during a read process. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

Figure 11A:
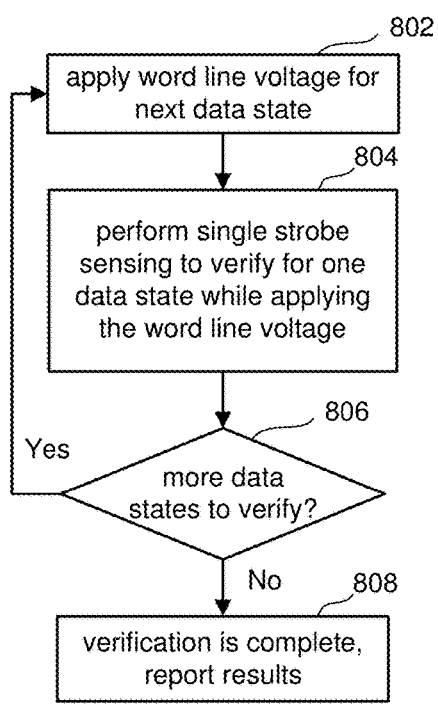
FIG. 11A is a flow chart describing one embodiment of a process for verifying programming.

As described above, when programming to sixteen data states, between programming pulses the system needs to separately test for fifteen verify compare voltages (Vv1, Vv2, Vv3, Vv4, Vv5, Vv6, Vv7, Vv8, Vv9, Vv10, Vv11, Vv12, Vv13, Vv14 and Vv15). Each verify operation includes applying one of the fifteen verify compare voltages to the selected word line. Between each verify operation, the word line voltage has to be changed by resetting down to ground and then applying the next verify compare voltage. FIG. 11A is a flow chart describing an example verification process, as described above. This process is known as one strobe sensing as only one sensing operation is performed each time the word line is set up with a new voltage. The single strobe sensing process of FIG. 11A is one example of a process that can be performed as part of step 774 of FIG. 10. In step 802 of FIG. 11A, the next verify compare voltage for the next data state is applied to the selected word line. For the embodiment of FIGS. 8A, 8B and 9A-E, if this is the first iteration of the process, then Vv1 is applied, the next iteration includes applying Vv2, etc. In step 804, a single strobe sensing operation performed (see discussion of sense amplifier below) for the verify compare voltage to test for programming to the current data state being verified. If more data states need to be verified, then the process loops back to step 802. If all data states that are supposed to be verified, have been verified, then the verification is complete (step 808) and the results are reported as part of the programming process. For one example implementation of the embodiment of FIGS. 8A, 8B and 9A-E, there will be fifteen iterations of the process of FIG. 11A—one for each of the data states S1-S15. In other embodiments, there will be sixteen iterations of the process of FIG. 11A—one for each of the data states S0-S15. In other embodiments, there can be more or less than fifteen iterations.

This, performing fifteen verify operations can slow down the programming process. To address the decrease in speed of the program/verify process because of the time needed to change the word line voltage, a variation of the above-described verification process can be used where the control gate (word line) voltage is the same for two verify operations, thereby reducing the number of times the word line needs to be reset and changed to the next verify compare voltage. In this scheme, the sense amplifier will test for two different threshold voltages sensing the memory cell for two different currents in response to a single word line voltage. This scheme is referred to a two strobe sensing. In other embodiments, rather than testing for two different threshold voltages, the sense amplifier can test for more than two different threshold voltages, thus the sense amplifier will be performing multi-strobe sensing to test for multiple data states while applying a common word line voltage.

This embodiment uses the nature of transistor Id-Vg characteristics, in which a higher current will detect a lower threshold voltage and a lower current will detect a higher threshold voltage. Thus, this embodiment (referred to herein as the current sensing verification system) performs the verification by performing two sensing procedures (also known as two strobes), both while the same voltage level is applied to the control gate of the memory cell. During one of the strobes, the sense amplifier tests whether the current through the memory cell is below a lower threshold voltage. During the second strobe, the systems tests whether the current through the memory cell is below the higher threshold voltage. If the multi-strobe sensing operation uses more than two strobes, then the later performed strobes test for higher threshold voltages.

One example implementation of the current sensing verification system charges a capacitor (or, in some embodiments, another type of charge storage device) and then allows the capacitor to discharge through the bit line and NAND string (including the selected memory cell). If the unselected memory cells on the NAND string all receive a large enough control gate voltage to turn them on and act as pass gates, then the charge on the capacitor will effectively be discharged through the selected memory cell to the source line if the voltage applied to the control gate of the selected memory cell was large enough (in comparison to the threshold voltage of the memory cell) to cause the channel of the memory cell to conduct. If the voltage applied to the control gate of the selected memory cell was not large enough (to cause the channel of the memory cell to conduct), the capacitor will not discharge. As the transistors that form the memory cells are not ideal devices, the current will be a function of the control gate voltage, rather than on for control gate voltages above the threshold voltage and off for control gate voltages below the threshold voltage. After a predetermined period of time (known as the strobe time), the voltage across the capacitor can be measured. If the selected memory cell sufficiently conducted current, then a sufficient amount of charge will have dissipated from the capacitor and the voltage would be decreased by at least a predetermined amount. If the selected memory cell did not sufficiently conduct current, then the voltage across the capacitor would not have decreased by the predetermined amount. Therefore, testing the voltage across the capacitor after the strobe time is indication of whether the current was above or below a predetermined current compare level, which is itself an indication of whether the threshold voltage of the selected memory cell is above the read or verify compare value being applied to its control gate (word line). To test for two current levels (and two threshold voltages), the system can perform two (or multi) strobe sensing using the same control gate voltage and different strobe times. A shorter strobe time is used to test for the higher current corresponding to the lower threshold voltage and the longer strobe time is used to test for the lower current corresponding to the higher threshold voltage. This verification system saves time by not needing to set up a new control gate voltage between the two sense operations.

Figure 11B:
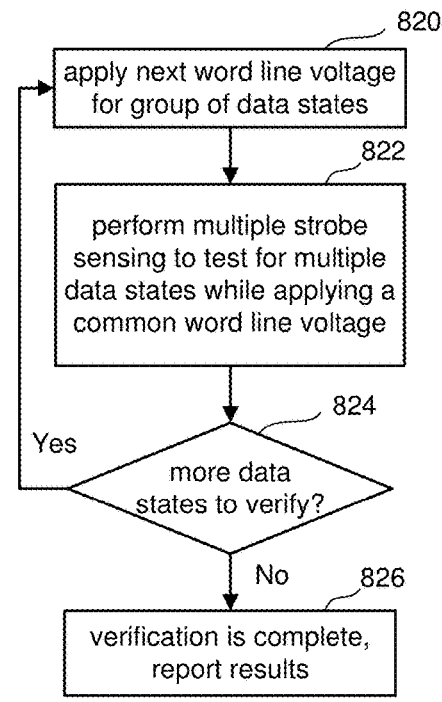
FIG. 11B is a flow chart describing one embodiment of a process for verifying programming.

FIG. 11B is a flow chart describing another example verification process (an alternative to FIG. 11A), as described above. This process is known as multi-strobe sensing as multiple (two, three, four, etc.) sensing operations are performed each time the word line is set up with a new voltage. The multi-strobe sensing process of FIG. 11B is another example of a process that can be performed as part of step 774 of FIG. 10. In step 820 of FIG. 11B, the next verify compare voltage for the next data state is applied to the selected word line. For the embodiment of FIGS. 8A and 8B, if this is the first iteration of the process, then Vv1 is applied, the next iteration includes applying Vv2, etc. In step 822, a multiple strobe sensing operation performed (see discussion of sense amplifier below) for the verify compare voltage to test for programming to multiple data states. If more data states need to be verified, then the process loops back to step 820. If all data states that are supposed to be verified, have been verified, then the verification is complete (step 826) and the results are reported as part of the programming process. Because multiple data states are test for during each iteration of FIG. 11B, there are less than 15 iterations performed.

Figure 11C:
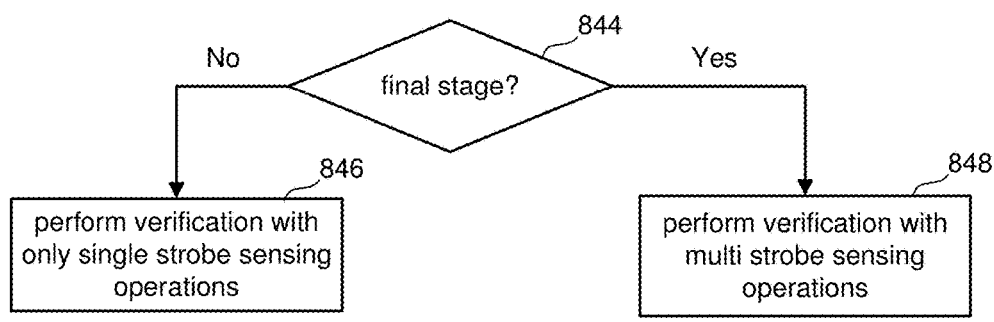
FIG. 11C is a flow chart describing one embodiment of a process for verifying programming.

In one embodiment, if the system is performing full sequence programming, then the multi-strobe sensing process of FIG. 11B is performed to implement step 774 of FIG. 10, and if the system is performing a multi-stage programming process (e.g., FIGS. 9A-E), then the single strobe sensing process of FIG. 11A is performed to implement step 774 of FIG. 10 for all stages before (previous to) the final stage and the multi-strobe sensing process of FIG. 11B is performed to implement step 774 of FIG. 10 for the final stage. This concept is embodied in the process of FIG. 11C, which is a process that can be performed for multi-stage programming processes as part of step 774 of FIG. 10. In step 844, it is determined whether the current stage of the programming process is the final stage (ie the fourth stage of a four stage programming process). If not, then in step 846 the verification is performed with only singe strobe sensing operations (e.g., the process of FIG. 11A). If the current stage of the programming process is the final stage, then in step 848 the verification is performed with a multi-strobe sensing operations (e.g., the process of FIG. 11B).

Figure 12:
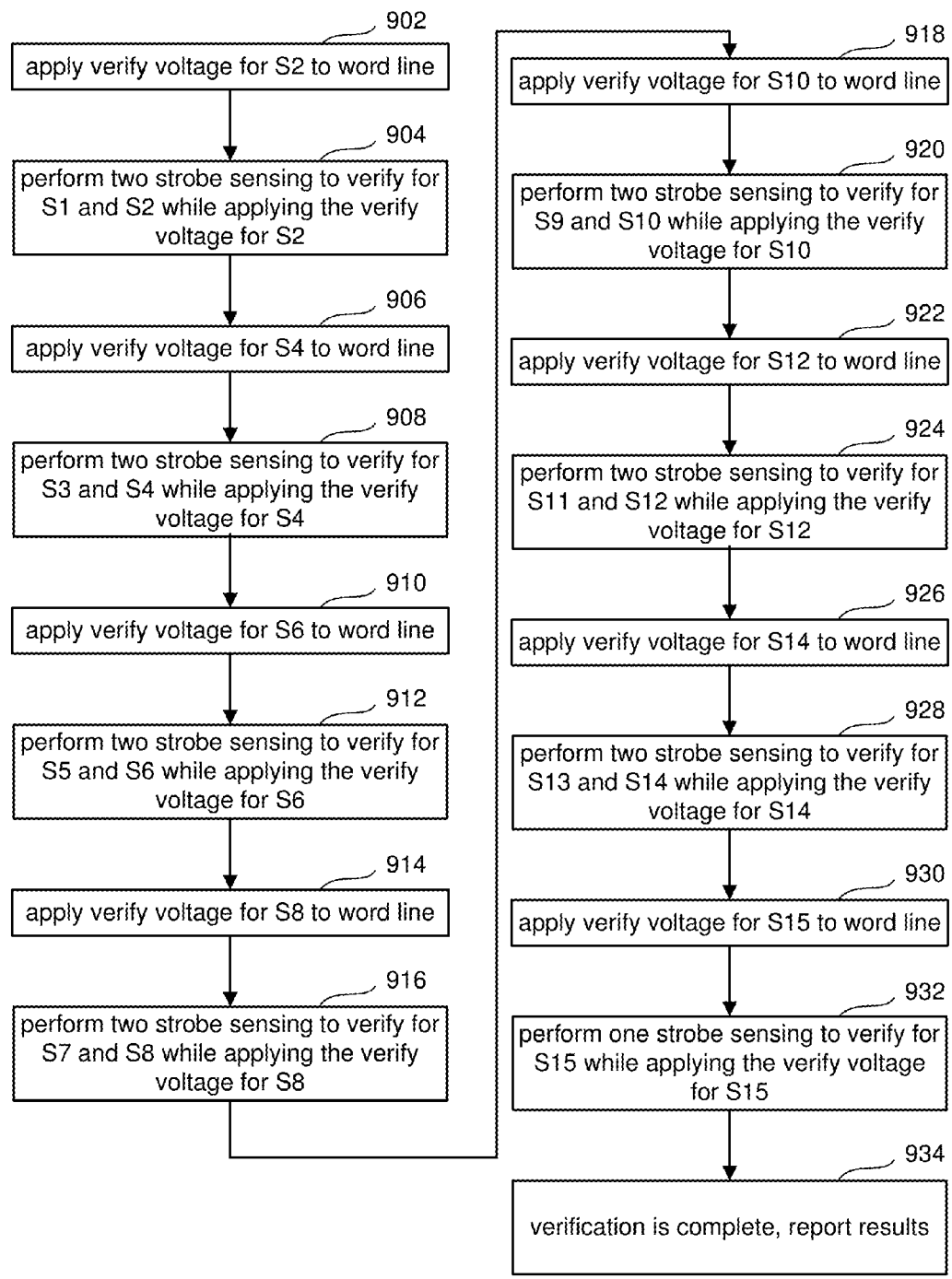
FIG. 12 is a flow chart describing one embodiment of a process for verifying programming.

FIG. 12 is a flow chart describing one example of performing verification using multi-strobe sensing operations. The process depicted in FIG. 12 is one example implementation of FIG. 11B for the embodiments of FIGS. 8A and 8B, and can be sued to perform verification as part of step 774 of FIG. 10. Steps 902, 906, 910, 914, 918, 922, 926, and 930 of FIG. 12 are iterations of step 820 of FIG. 11B. Steps 904, 908, 912, 916, 920, 924, 928 and 932 of FIG. 12 are iterations of step 822 of FIG. 11B. Step 934 of FIG. 12 corresponds to step 826 of FIG. 11B.

In step 902 of FIG. 12, the verify voltage Vv2 for data state S2 is applied to the selected word line (the word line connected to the memory cell(s) being programmed). In step 904, a two strobe sensing process is performed to verify for data states S1 and S2 while applying the verify voltage Vv2 for data state S2 is applied to the selected word line. That is, while applying Vv2 to the selected word line, the system performs two strobes to test whether the threshold voltage of the selected memory cell(s) are above Vv1 and to test whether the threshold voltage of the selected memory cell(s) are above Vv2.

In step 906 of FIG. 12, the verify voltage Vv4 for data state S4 is applied to the selected word line (the word line connected to the memory cell(s) being programmed). In step 908, a two strobe sensing process is performed to verify for data states S3 and S4 while applying the verify voltage Vv4 for data state S4 is applied to the selected word line. That is, while applying Vv4 to the selected word line, the system performs two strobes to test whether the threshold voltage of the selected memory cell(s) are above Vv3 and to test whether the threshold voltage of the selected memory cell(s) are above Vv4.

In step 910 of FIG. 12, the verify voltage Vv6 for data state S6 is applied to the selected word line (the word line connected to the memory cell(s) being programmed). In step 9012, a two strobe sensing process is performed to verify for data states S5 and S6 while applying the verify voltage Vv6 for data state S6 is applied to the selected word line. That is, while applying Vv6 to the selected word line, the system performs two strobes to test whether the threshold voltage of the selected memory cell(s) are above Vv5 and to test whether the threshold voltage of the selected memory cell(s) are above Vv6.

In step 914 of FIG. 12, the verify voltage Vv8 for data state S8 is applied to the selected word line (the word line connected to the memory cell(s) being programmed). In step 916, a two strobe sensing process is performed to verify for data states S7 and S8 while applying the verify voltage Vv8 for data state S2 is applied to the selected word line. That is, while applying Vv8 to the selected word line, the system performs two strobes to test whether the threshold voltage of the selected memory cell(s) are above Vv7 and to test whether the threshold voltage of the selected memory cell(s) are above Vv8.

In step 918 of FIG. 12, the verify voltage Vv10 for data state S10 is applied to the selected word line (the word line connected to the memory cell(s) being programmed). In step 920, a two strobe sensing process is performed to verify for data states S9 and S10 while applying the verify voltage Vv10 for data state S10 is applied to the selected word line. That is, while applying Vv10 to the selected word line, the system performs two strobes to test whether the threshold voltage of the selected memory cell(s) are above Vv9 and to test whether the threshold voltage of the selected memory cell(s) are above Vv10.

In step 922 of FIG. 12, the verify voltage Vv12 for data state S12 is applied to the selected word line (the word line connected to the memory cell(s) being programmed). In step 924, a two strobe sensing process is performed to verify for data states S11 and S12 while applying the verify voltage Vv12 for data state S12 is applied to the selected word line. That is, while applying Vv12 to the selected word line, the system performs two strobes to test whether the threshold voltage of the selected memory cell(s) are above Vv11 and to test whether the threshold voltage of the selected memory cell(s) are above Vv12.

In step 926 of FIG. 12, the verify voltage Vv14 for data state S14 is applied to the selected word line (the word line connected to the memory cell(s) being programmed). In step 928, a two strobe sensing process is performed to verify for data states S13 and S14 while applying the verify voltage Vv14 for data state S14 is applied to the selected word line. That is, while applying Vv14 to the selected word line, the system performs two strobes to test whether the threshold voltage of the selected memory cell(s) are above Vv13 and to test whether the threshold voltage of the selected memory cell(s) are above Vv14.

In step 930 of FIG. 12, the verify voltage Vv15 for data state S15 is applied to the selected word line (the word line connected to the memory cell(s) being programmed). In step 932, a single strobe sensing process is performed to verify for data state S15 while applying the verify voltage Vv15. In step 934, verification is complete and results of the verification are reported to the state machine, controller or other component.

Figure 13:
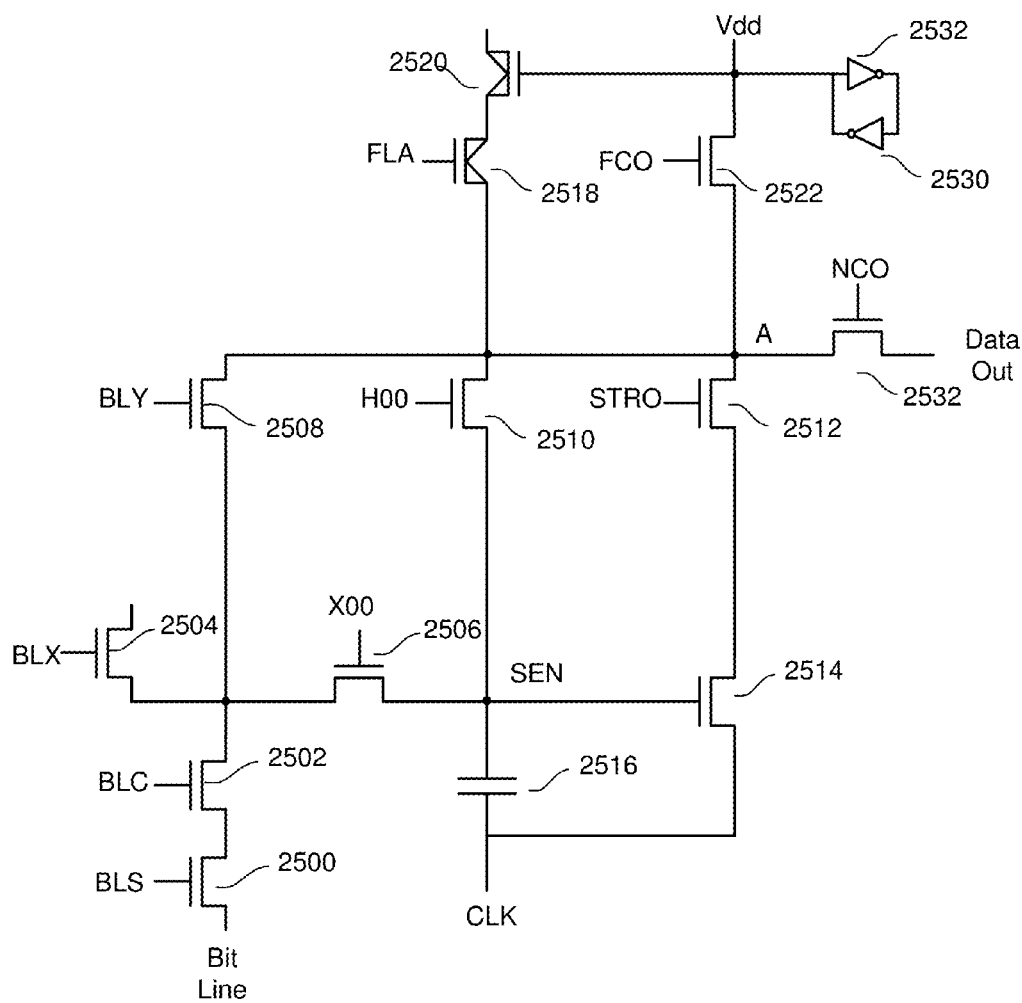
FIG. 13 is a schematic diagram of one embodiment of a sense amplifier circuit.

FIG. 13 is a schematic diagram depicting a circuit from a sense block (see FIG. 1B). As described below, the circuit of FIG. 13 will pre-charge a capacitor (or other charge storage device) to a pre-charge magnitude, discharge the capacitor through the memory cell for a strobe time, and sense voltage at the capacitor after the strobe time. Though FIG. 13 features one capacitor, in some embodiments, any suitable charge storage device can replace or complement this capacitor. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described above. FIG. 13 shows transistor 2500 connected to the Bit Line and transistor 2502. Transistor 2500 receives the signal BLS at its gate, and is used to connect to or isolate the Bit Line. Transistor 2502 receives the signal BLC at its gate, and is used as a voltage clamp. The gate voltage BLC is biased at a constant voltage equal to the desired Bit Line voltage plus the threshold voltage of transistor 2502. The function of transistor 2502, therefore, is to maintain a constant Bit Line voltage during a sensing operation (during read or verify), even if the current through the Bit Line changes. In some embodiments of the disclosed technology, BLC is subject to adjustment in order to vary the bit line voltage according to the programmed state of the block and/or the location of the word line being sensed with respect to the source select line.

Transistor 2502 is connected to transistors 2504, 2506 and 2508. Transistor 2506 is connected to capacitor 2516 at the node marked SEN. The purpose of transistor 2506 is to connect capacitor 2516 to Bit Line 2500 and disconnect capacitor 2516 from Bit Line 2500 so that capacitor 2516 is in selective communication with Bit Line 2500. While transistor 2506 is turned on capacitor 2516 can discharge through the Bit Line, and when transistor 2506 is turned off capacitor 2516 cannot discharge through the Bit Line.

The node at which transistor 2506 connects to capacitor 2516 is also connected to transistor 2510 and transistor 2514. Transistor 2510 is connected to transistors 2508, 2512 and 2518. Transistor 2518 is also connected to transistor 2520. Transistors 2518 and 2520 are PMOS transistors while the other transistors of FIG. 25 are NMOS transistors. Transistors 2510, 2518, and 2520 provide a pre-charging path to capacitor 2516. A voltage (e.g. Vdd or other voltage) is applied to the source of transistor 2520. By appropriately biasing transistors 2510, 2518 and 2520, the voltage applied to the source of transistor 2520 can be used to pre-charge capacitor 2516. After pre-charging, capacitor 2516 can discharge through the Bit Line via transistor 2506 (assuming that transistors 2500 and 2502 are conducting).

The circuit of FIG. 13 includes inverters 2530 and 2532 forming a latch circuit. The output of inverter 2532 is connected to the input of inverter 2530 and the output of inverter 2530 is connected to the input of inverter 2532 as well as transistors 2520 and 2522. The input of inverter 2532 will receive Vdd and the two inverters 2530, 2532 will act as a latch to store Vdd. The input of inverter 2532 can also be connected to another value. Transistors 2512 and 2522 provide a path for communicating the data stored by inverters 2530 and 2532 to transistor 2514. Transistor 2522 receives the signal FCO at its gate. Transistor 2512 receives the signal STRO at its gate. By raising or lowering FCO and STRO, a path is provided or cut off between the inverters 2530, 2532 and transistor (sensing switch) 2514. The gate of transistor 2514 is connected capacitor 2516, transistor 2506 and transistor 2510 at the node marked SEN. The other end of capacitor 2516 is connected to the signal CLK.

Capacitor 2516 is pre-charged via transistors 2510, 2518 and 2520. This will raise the voltage at the SEN node to a pre-charge voltage level (Vpre). When transistor 2506 turns on, capacitor 2516 can discharge its charge through the Bit Line and the selected memory cell if the threshold voltage of the memory cell is below the voltage level being tested for. If the capacitor 2516 is able to discharge, then the voltage at the capacitor (at the SEN node) will decrease. The performing of the multi-strobe sensing operation discussed above includes pre-charging the capacitor and connecting the pre-charged capacitor to the non-volatile storage element so that the pre-charged capacitor has an opportunity to be discharged via the selected memory cell. The multi-strobe sensing mentioned herein includes performing multiple strobes after a single pre-charging of the capacitor. Put another way, multiple strobes are performed for a single pre-charging of the capacitor. The multiple strobes are performed during a common discharging of the charge storage device.

The pre-charge voltage (Vpre) at the SEN node is greater than the threshold voltage of transistor 914; therefore, prior to the strobe time, transistor 2514 is on (conducting). Since transistor 2514 is on during the strobe time, then transistor 2512 should be off. If the capacitor does not discharge during the strobe time, then the voltage at the SEN node will remain above the threshold voltage of transistor 2514 and the charge at the inverters 2530, 2532 can be discharged into the CLK signal when STRO turns on transistor 2512. If the capacitor discharges sufficiently during the strobe time, then the voltage at the SEN node will decrease below the threshold voltage of transistor 2514; thereby, turning off transistor 914 and the data (e.g., Vdd) stored at inverters 2530, 2532 from being discharged through CLK. So testing whether the diodes 2530, 2532 maintain their charge or discharge will indicate the result of the verification process. In one embodiment, the result can be read at node A via transistor 2534 (Data Out) by turning on transistor 2534 gate signal NCO.

The pre-charge level of capacitor 2516 (and, thus, the pre-charge voltage at node SEN) is limited by the current passing through transistor 2510. The current that passes through transistor 2510 is limited by the gate voltage H00. As such, the pre-charge voltage at node SEN is limited by the voltage H00 less the threshold voltage of transistor 2510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read operation, the voltage applied to the control gate of the cell may cause the channel (connected to the bit line) of the cell to conduct. If this happens, a capacitor is discharged through the channel, lowering in voltage as it discharges.

Figure 14:
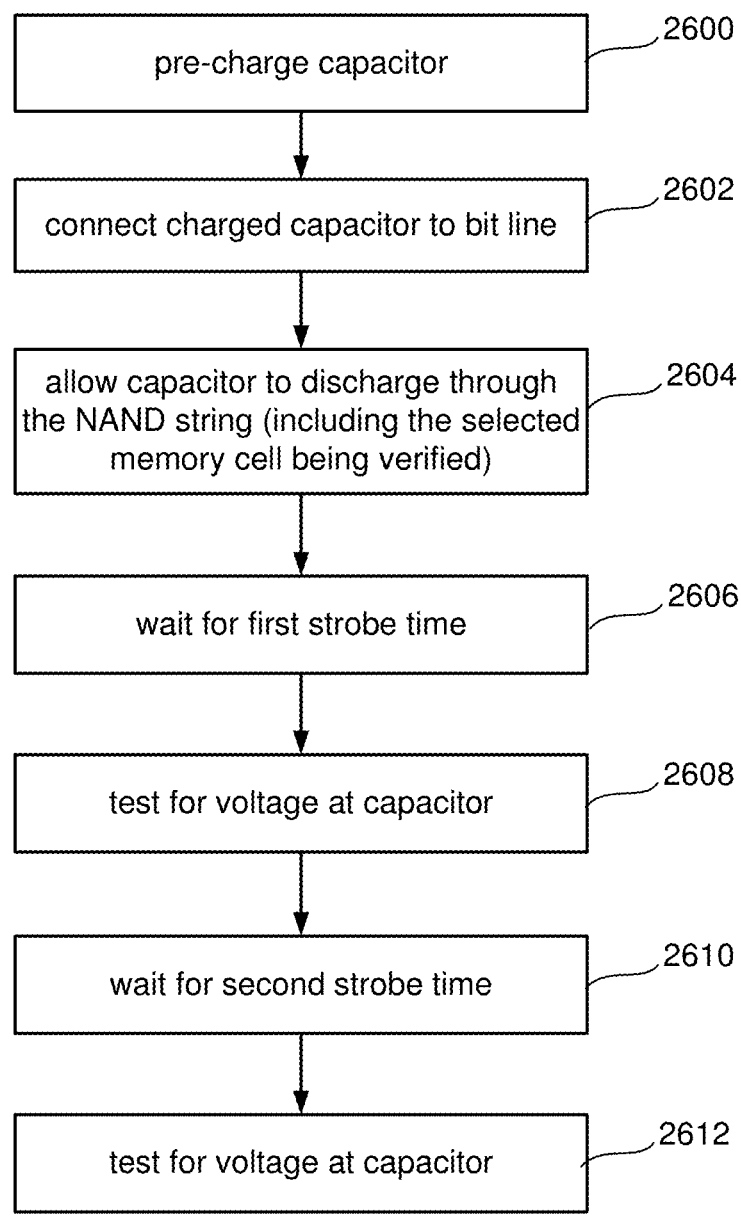
FIG. 14 is a flow chart describing one embodiment of a process for performing a multi-strobe sensing operation.

FIG. 14 is a flowchart describing one embodiment of a process for using the circuit of FIG. 13 to perform multiple strobe sensing to test for multiple data states while applying a common word line voltage, and includes one example implementation of step 822 of FIG. 11B. In step 2600 of FIG. 26, the capacitor (or other charge storage device) will be pre-charged to a pre-determined voltage level. In step 2602, the pre-charged capacitor (or other charge storage device) will be connected to the bit line. In step 2604, the capacitor will be provided the opportunity to discharge its charge through the bit line and NAND string (including the selected memory cell being verified). In step 2606, the system will wait for a first strobe time to elapse. In step 2608, the first strobe will be performed to test the voltage at the capacitor. As described above, in one embodiment, the system will test whether the capacitor has been sufficiently discharged. In other embodiment, the actual voltage across the capacitor can be measured or the current can be measures, etc. In step 2610, the system will wait for a first strobe time to elapse. The second strobe time can be measured from the start of the discharge or from the end of the first strobe time. In step 2612, the second strobe will be performed to test the voltage at the capacitor. As described above, in one embodiment, the system will test whether the capacitor has been sufficiently discharged. In other embodiment, the actual voltage across the capacitor can be measured or the current can be measures, etc.

One embodiment includes a method of operating non-volatile storage, comprising applying programming to a non-volatile storage element; and verifying the programming of the non-volatile storage element, including performing a multi-strobe sensing operation to test for multiple data states while applying a common word line voltage. In one example implementation, the performing the multi-strobe sensing operation includes pre-charging a charge storage device and connecting the pre-charged charge storage device to the non-volatile storage element so that the pre-charged charge storage device has an opportunity to be discharged via the non-volatile storage element.

One embodiment includes a non-volatile storage device, comprising: a plurality of non-volatile storage elements; word lines in communication with the non-volatile storage elements; bit lines in communication with the non-volatile storage elements; and one or more control circuits in communication with the bit lines and the word lines, the one or more control circuits are configured to program a selected non-volatile storage element, the one or more control circuits are configured to verify the programming of the selected non-volatile storage element by applying a first compare voltage on a selected word line and sensing the selected non-volatile storage element multiple times for different data states while continuing to apply the first compare voltage on the selected word line, the selected non-volatile storage element is in communication with the selected word line and a selected bit line.

One embodiment includes a non-volatile storage device, comprising: a plurality of non-volatile storage elements arranged in a monolithic three dimensional structure; word lines in communication with the non-volatile storage elements; bit lines in communication with the non-volatile storage elements; sense amplifiers in communication with the bit lines, the sense amplifiers include a charge storage device; and control circuitry in communication with the word lines and the sense amplifiers, the control circuitry is configured to drive a word line voltage on a selected word line during a program verification operation, a selected sense amplifier and the control circuitry are configured to pre-charge the charge storage device of the selected sense amplifier and connect the pre-charged charge storage device to a selected bit line during the program verification operation so that the pre-charged charge storage device has an opportunity to be discharged via the selected bit line; the control circuitry is configured to sense two times to test for successful programming to two data states while driving the word line voltage on the selected word line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage, comprising:
   applying programming to a non-volatile storage element coupled to a selected word line; and
   verifying the programming of the non-volatile storage element, including performing a multi-strobe sensing operation to test for at least two different data states while applying a same word line voltage to the selected word line for the multi-strobe sensing operation.

2. The method of claim 1, wherein:
   the performing the multi-strobe sensing operation includes pre-charging a charge storage device and connecting the pre-charged charge storage device to the non-volatile storage element so that the pre-charged charge storage device has an opportunity to be discharged via the non-volatile storage element.

3. The method of claim 2, wherein:
   the multi-strobe sensing operation includes performing multiple strobes for the pre-charging of the charge storage device.

4. The method of claim 2, wherein:
   the multi-strobe sensing operation includes performing multiple strobes during a common discharging of the charge storage device.

5. The method of claim 2, wherein:
   the charge storage device is a capacitor.

6. The method of claim 2, wherein:
   the non-volatile storage element is configured to store multiple bits of data in any of multiple data states, the multiple data states include a first data state and a second data state, the second data state represents threshold voltages greater than threshold voltages represented by the first data state;
   the multi-strobe sensing operation includes applying a verify compare voltage for the second data state, performing a first strobe to test for successful programming to the first data state and performing a second strobe after the first strobe to test for successful programming to the second data state;
   the first strobe and the second strobe are performed in response to the pre-charging of the charge storage device; and
   the first strobe and the second strobe are performed during a common discharging of the charge storage device.

7. The method of claim 1, wherein:
   the applying programming to the non-volatile storage element includes performing a full sequence programming operation to store four bits of data in the non-volatile storage element.

8. The method of claim 1, wherein:
   the applying programming to the non-volatile storage element includes performing a multi-stage programming process;
   the multi-stage programming process includes a final stage and previous stages that are performed prior to the final stage; and
   the verifying programming includes performing only single strobe sensing operations when verifying the previous stages and performing the multi-strobe sensing operation when verifying the final stage.

9. The method of claim 1, wherein:
   the non-volatile storage element is part of a three dimensional memory structure.

10. A non-volatile storage device, comprising:
    a plurality of non-volatile storage elements;
    word lines in communication with the non-volatile storage elements;
    bit lines in communication with the non-volatile storage elements; and
    one or more control circuits in communication with the bit lines and the word lines, the one or more control circuits are configured to program a selected non-volatile storage element, the one or more control circuits are configured to verify the programming of the selected non-volatile storage element by applying a first compare voltage on a selected word line and sensing the selected non-volatile storage element multiple times for different data states while continuing to apply the first compare voltage on the selected word line, the selected non-volatile storage element is in communication with the selected word line and a selected bit line.

11. The non-volatile storage device of claim 10, wherein:
    the one or more control circuits are configured to sense the selected non-volatile storage element multiple times by pre-charging a charge storage device, connecting the pre-charged charge storage device to the selected non-volatile storage element so that the pre-charged charge storage device has an opportunity to be discharged via the selected non-volatile storage element, and performing multiple strobes in response to the pre-charging of the charge storage device.

12. The non-volatile storage device of claim 11, wherein:
    the one or more control circuits are configured perform the multiple strobes during a common discharging of the charge storage device.

13. The non-volatile storage device of claim 12, wherein:
    the charge storage device is a capacitor.

14. The non-volatile storage device of claim 10, wherein:
    the non-volatile storage element is configured to store multiple bits of data in any of multiple data states.

15. The non-volatile storage device of claim 10, wherein:
    the plurality of non-volatile storage elements are arranged in a monolithic three dimensional structure over a substrate.

16. A non-volatile storage device, comprising:
a plurality of non-volatile storage elements arranged in a monolithic three dimensional structure;
word lines in communication with the non-volatile storage elements;
bit lines in communication with the non-volatile storage elements;
sense amplifiers in communication with the bit lines, the sense amplifiers include a charge storage device; and
control circuitry in communication with the word lines and the sense amplifiers, the control circuitry is configured to drive a word line voltage on a selected word line during a program verification operation, a selected sense amplifier and the control circuitry are configured to pre-charge the charge storage device of the selected sense amplifier and connect the pre-charged charge storage device to a selected bit line during the program verification operation so that the pre-charged charge storage device has an opportunity to be discharged via the selected bit line;
the control circuitry is configured to sense two times to test for successful programming to two data states while driving the word line voltage on the selected word line.

17. The non-volatile storage device of claim 16, wherein:
the program verification operation is performed concurrently for multiple non-volatile storage elements connected to the selected word line.

18. The non-volatile storage device of claim 16, wherein:
the control circuitry is configured to sense two times to test for two data states for the pre-charge to the charge storage device.

19. The non-volatile storage device of claim 16, wherein:
the charge storage device is a capacitor, the control circuitry is configured to sense two times to test for two data states during a common discharging of the capacitor.

20. The non-volatile storage device of claim 16, wherein:
the non-volatile storage elements are multi-state flash memory cells.

21. A non-volatile storage device, comprising:
a non-volatile storage element configured to store multiple bits of data in any of multiple data states;
a word line connected to the non-volatile storage element;
a bit line in communication with the non-volatile storage element;
a sense amplifier connected to the bit line, the sense amplifier includes a charge storage device; and
one or more control circuits in communication with the bit line and the word line and the sense amplifier, the one or more control circuits are configured to program the non-volatile storage element;
the one or more control circuits are configured to verify the programming of the non-volatile storage element by pre-charging the charge storage device, connecting the pre-charged charge storage device to the non-volatile storage element so that the pre-charged charge storage device has an opportunity to be discharged via the non-volatile storage element, and performing multiple sensing of the charge storage device during a common discharging of the charge storage device and while applying a same voltage to the non-volatile storage element via the word line.

* * * * *